United States Patent
Vatelmacher et al.

(10) Patent No.: US 9,728,656 B2
(45) Date of Patent: Aug. 8, 2017

(54) SOLAR ARRAY MODULE SYSTEM FOR GENERATING ELECTRIC POWER

(71) Applicant: SOLARWAT LTD.

(72) Inventors: Boris Vatelmacher, Ganei Tikva (IL); Gabi Paz, Ganei Tikva (IL)

(73) Assignee: SOLARWAT LTD. (IL)

( * ) Notice: Subject to any disclaimer, the term of this patent is extended or adjusted under 35 U.S.C. 154(b) by 368 days.

(21) Appl. No.: 14/389,323

(22) PCT Filed: Mar. 30, 2013

(86) PCT No.: PCT/IL2013/050291
§ 371 (c)(1),
(2) Date: Sep. 29, 2014

(87) PCT Pub. No.: WO2013/144963
PCT Pub. Date: Oct. 3, 2013

(65) Prior Publication Data
US 2015/0162458 A1  Jun. 11, 2015

Related U.S. Application Data

(60) Provisional application No. 61/617,771, filed on Mar. 30, 2012.

(51) Int. Cl.
*H01L 31/042* (2014.01)
*H02J 1/12* (2006.01)
*H01L 31/02* (2006.01)

(52) U.S. Cl.
CPC .......... *H01L 31/02021* (2013.01); *H02J 1/12* (2013.01); *Y02E 10/50* (2013.01); *Y10T 307/685* (2015.04)

(58) Field of Classification Search
CPC ...... H02J 1/12; H01L 31/02021; Y02E 10/50; Y10T 307/685
See application file for complete search history.

(56) References Cited

U.S. PATENT DOCUMENTS 4,409,537 A    10/1983  Harris
5,637,155 A     6/1997  Inoue
(Continued)

FOREIGN PATENT DOCUMENTS

CN    101924150 A    12/2010
JP    S5764980 A      4/1982
(Continued)

OTHER PUBLICATIONS

JP2012/204651 Machine Translation of Text, and associated Figures.*
(Continued)

*Primary Examiner* — Jared Fureman
*Assistant Examiner* — James Evans
(74) *Attorney, Agent, or Firm* — Polsinelli PC

(57) ABSTRACT

A modular solar panel system facilitated to maximize the power generation from a solar module, configured to maximize power generation from a plurality of solar cells under conditions of partial shade or light obstruction. The modular solar panel system includes a crisscross network configuration of solar cell arrays, wherein the solar cells are often subjected to at least partial shading and wherein the present invention provides innovative configurations to minimize the damage inflicted by the shadows.

54 Claims, 26 Drawing Sheets

(56) References Cited

U.S. PATENT DOCUMENTS

| | | | |
|---|---|---|---|
| 7,116,014 B1* | 10/2006 | Herbert | H02J 1/00 |
| | | | 307/36 |
| 2008/0142071 A1 | 6/2008 | Dorn et al. | |
| 2010/0186799 A1 | 7/2010 | Gaul | |
| 2010/0308660 A1* | 12/2010 | Willis | G05F 1/67 |
| | | | 307/77 |
| 2010/0313930 A1 | 12/2010 | Yokobayashi et al. | |
| 2011/0037600 A1* | 2/2011 | Takehara | H01L 31/02021 |
| | | | 340/635 |
| 2012/0056484 A1* | 3/2012 | Mumtaz | H01L 31/02021 |
| | | | 307/86 |
| 2012/0062036 A1 | 3/2012 | Rabinovici et al. | |
| 2012/0133322 A1* | 5/2012 | Walsh | B60L 8/00 |
| | | | 320/101 |
| 2012/0298181 A1* | 11/2012 | Cashion | F24J 2/5424 |
| | | | 136/246 |
| 2013/0284233 A1* | 10/2013 | Kataoka | H01L 31/042 |
| | | | 136/244 |
| 2015/0008748 A1* | 1/2015 | Deboy | H02J 3/383 |
| | | | 307/77 |

FOREIGN PATENT DOCUMENTS

| | | |
|---|---|---|
| JP | 2003092418 A | 3/2003 |
| JP | 2006-039634 | 9/2006 |
| JP | 2010-287795 | 12/2010 |
| JP | 2012-169581 | 9/2012 |
| JP | 2012204651 A | 10/2012 |
| WO | 2011089607 A1 | 7/2011 |

OTHER PUBLICATIONS

English abstract of CN101924150; Retrieved from www.espacenet.com on Sep. 6, 2016.

English abstract of JPS5764980; Retrieved from www.espacenet.com on Sep. 6, 2016.

International Search Report for International PCT Application PCT/IL2013/050291 dated Jul. 23, 2013.

English Abstract of JP2006-039634.

English Machine Translation of JP2006-039634; Retrieved from www.espacenet.com on Jan. 13, 2017.

English Abstract of JP2010-287795; Retrieved from www.espacenet.com on Jan. 30, 2017.

English Abstract of JP2012-169581; Retrieved from www.espacenet.com on Jan. 30, 2017.

* cited by examiner

CELLS CONNECTION FOR 200W PANEL HORIZONTAL PLACEMENT
5 X 10 CELLS
ELECTRICALLY: 5 * 10 = 2 * (5 X 5) CELLS

SOLAR ARRAY MODULE SYSTEM FOR GENERATING ELECTRIC POWER

FIELD OF THE INVENTION

The present invention relates to a solar array module system for generating electric-power and more particularly, to a solar array module system facilitated to maximize the power generation from a solar module, configured to reduce the effects of light obstruction and to maximize the power generation from a plurality of solar cells, interconnected in a matrix configuration.

BACKGROUND OF THE INVENTION

Photovoltaic cells have been widely used in a variety of applications to generate convenient electricity. Typically, a single solar cell produces an output voltage of around 0.5V, and a plurality of cells, typically Silicon based, is conventionally connected in series to provide higher voltage levels. The solar cells are typically interconnected in solar-arrays, as described in PCT Published Application No. WO/2011/089607 filed on Jan. 23, 2011, by the same inventor as the instant application and which is owned in common, which is hereby incorporated by reference in its entirety.

A solar-array, having a crisscross network configuration, is typically embodied in a single solar module, wherein each solar-array module includes a multiplicity of solar cells. The solar modules are typically tilted towards the sun, and typically follow the path of the sun. However, at dawn and dusk, the angle of the sun is very low and one module may cast a shadow on a portion of a neighboring module, typically on the lower rows of cells of the solar-array module. Light may also be blocked or obstructed due to dust or snow, also typically proximal to the lower cells of the solar-array module. Thereby, the light obstruction causes a substantial reduction in the productivity of the module.

Solar array modules are often part of a solar system that includes a multiplicity of solar-array modules disposed in an array configuration. Reference is now made to FIG. 1 showing a prior art geometry of tilted solar modules of a solar-array module 100, tilted at an angle β this example, solar-array module 100a and 100b are disposed on a substantially horizontal surface, wherein solar-array module 100a is positioned in front of solar-array module 100b, with respect to the sun. When the sun is in a pitch angle of α above the horizon, solar-array module 100a having a length l, casts a shadow on the ground surface with a displacement of d, no shadow is cast over solar-array module 100b. But, when the sun is in a lower pitch angle than α, say $\alpha_2$, solar-array module 100a casts a shadow also over the lower section of solar-array module 100b. In this example, solar-array module 100a casts a shadow on the region delimited between $P_0$ and $P_2$ of solar-array module 100b, while only the solar cells disposed between $P_2$ and $P_1$ produce electric power.

Reference is also made to FIG. 2, schematically showing an example solar-array module 100 in horizontal placement, including crisscross network of solar cells 110. In this, example, solar-array module 100 includes 50 solar cells 110, arranged in 10 columns ("strings" 1-10) 130 and 5 rows (a-e) 120, wherein each column includes 5 solar cells 110, connected with interconnections 132, forming rows 120. If, for example, all 50 solar cells 110 are illuminated, solar-array module 100 produces 180 W over load R, with a combined current I of Imax (A). Unfortunately, the crisscross networking in this placement does not solve the light obstruction problem. When the solar cells 110 in a particular row of cells are overcast or otherwise in the shade, and thereby are not electrically active, each of the cells in that row of cells actually blocks transmission of electricity in the respective columns (string of cells) 120 of solar cells 110, thereby reducing the amount of energy that can be produced The "crisscross" implementation relates to a previously described invention by the same inventor, published in PCT Published Application No. WO/2011/089607, which is hereby incorporated by reference as if fully described herein. A "crisscross" implementation is an electrical wiring configuration in which the electrical interconnections between cells are determined according to a regular grid pattern which interconnects all neighboring cells. By contrast, the presently claimed invention relates to electrical interconnections which are not necessarily determined according to a regular grid pattern.

However, the crisscross networking in the placement of the previously described invention does not solve the light obstruction problem. When the solar cells 110 in a particular row of cells are overcast or otherwise in the shade, and thereby are not electrically active, each of the cells in that row of cells actually blocks transmission of electricity in the respective columns (string of cells) 120 of solar cells 110, thereby reducing the amount of energy that can be produced.

For example, as shown in to FIG. 3a, when all of the solar cells 110 of a row 122 of example solar-array module 100, such as the bottom row 122e, for example only, are completely shaded (that is, the light is obstructed from reaching solar cells 110 of row 122e), the current in each string of cells 110 is 0A, as the complete electric circuit cannot be formed. Although the crisscross configuration means that the solar cells 110 of each are also connected in parallel to respective solar cells 110 in adjacent strings, the current produced by each illuminated solar cell 110 has no pathway to load R since the respective solar cell 110 in row 122e blocks the electrical circuit. FIG. 3b schematically shows a variation of solar-array module 100, wherein solar-array module 100 operate with no obstructions. Current I flows through the strings 112 of solar cells 110. However, when the solar cells 110 of a row 122, such as the bottom row 122e, are completely shaded, as shown in FIG. 3c, the shaded cells 110 cut off the flow of current I.

SUMMARY OF THE INVENTION

There is therefore a need and it would be advantageous to have one or more configurations of interconnectivity between solar cells 110, in a solar-array module having a crisscross network configuration, wherein such configuration facilitates maximization of the power generated by a solar-array module in which solar-array module, one or more rows of solar cells malfunction, the solar-array module being in a horizontal placement. Such reduced functionality may be due to solar cell malfunction in one or more rows and/or to obstruction of light from reaching one or more rows of solar cells.

According to at least some embodiments of the present invention, there is provided a solar-array module that includes a solar power generation system for providing operating power for a desired application and for minimizing the power degradation inflicted by generally horizontal light obstructions, the system including at least one solar-array module, physically disposed substantially horizontal.

The at least one solar array module includes a multiplicity of solar cells, physically arranged in a N×M matrix configuration, and at least one high efficiency DC/DC power transformer electrically connected to the crisscross matrix array of solar cells, the DC/DC power transformer configured to boost the first output voltage level to a second output voltage level higher than the first output voltage level, wherein the first output voltage level is insufficient to meet the desired application operating voltage level requirement.

A preconfigured number (M) of the solar cells are electrically connected in series to form a string of serial-units, the string of serial-units is facilitated to produce a first output voltage level. A preconfigured number (N) of the strings of serial-units are electrically connected in parallel to form an array of the solar cells, the array of the solar cells is facilitated to produce a first output power level.

In each of the strings of serial-units, at least one selected solar cell of one of the strings of serial-units is also electrically connected in parallel to a respective solar cell of all other strings of serial-units, to form a plain, electrically interconnected electrical crisscross N×M matrix array of solar cells.

An aspect of the present invention is to provide a solar system, wherein at least two of the solar cells in the electrically interconnected electrical crisscross N×M matrix array of solar cells do not overlap with the respective solar cells in the physical N×M matrix configuration of solar cells.

According to at least some embodiments of the present invention, the physical cell-positioning configuration includes at least one relocation exchange of at least one of the solar cells with another solar cell, situated in another string of serial-units and in different row of the physical matrix, and wherein all cells, including both of the exchanged solar cells, maintain the electric crisscross matrix connectivity to thereby cause the N×M electrical crisscross matrix array of solar cells not to overlap with the respective solar cells with the N×M physical matrix configuration of solar cells.

According to at least some embodiments of the present invention, when N=M*2, the N×M physical matrix configuration of solar cells is rearranged by subdividing the physical matrix into two N/2×M matrices: a left matrix and a right matrix, wherein the solar cells are arranged in vertical strings. The solar cells of the left matrix are disposed such that the solar cells of the left matrix form a matrix that is rotated 90° counterclockwise with respect to the plain electrical crisscross matrix array, and thereby, physically, the vertical strings become horizontal strings. The solar cells of the right matrix are disposed such that the solar cells of the right matrix form a matrix that is rotated 90° clockwise with respect to the plain electrical crisscross matrix array, and thereby, physically, the vertical strings become horizontal strings. The solar cells are interconnected such that the "+" polarity of each of the new horizontal strings is electrically connected to the "+" input of the DC/DC power transformer and the "−" polarity of each of the new horizontal strings of solar cells is connected to the "−" input of the DC/DC power transformer.

According to some other embodiments of the present invention, when N=M*2, the N×M physical matrix configuration of solar cells is rearranged by subdividing the physical matrix into two N/2×M matrices: a left matrix and a right matrix, wherein the solar cells are arranged in vertical strings. The solar cells of the left matrix are disposed such that the solar cells of the left matrix form a matrix that is rotated 90° clockwise with respect to the plain electrical crisscross matrix array, and thereby, physically, the vertical strings become horizontal strings. The solar cells of the right matrix are disposed such that the solar cells of the right matrix form a matrix that is rotated 90° counterclockwise with respect to the plain electrical crisscross matrix array, and thereby, physically, the vertical strings become horizontal strings. The solar cells are interconnected such that the "+" polarity of each of the new horizontal strings is electrically connected to the "+" input of the DC/DC power transformer and the "−" polarity of each of the new horizontal strings of solar cells is connected to the "−" input of the DC/DC power transformer.

According to at least some embodiments of the present invention, the N×M physical matrix configuration of solar cells is rearranged by subdividing the physical matrix into two generally equal matrices: a left matrix and a right matrix, wherein the solar cells are arranged in vertical strings. The solar cells of the left matrix are individually rotated 90° clockwise and wherein each row of the rotated solar cells are electrically interconnected into new horizontal strings, wherein the solar cells of the right matrix are individually rotated 90° counterclockwise and wherein each row of the rotated solar cells are electrically interconnected into new horizontal strings. The solar cells are interconnected such that the "+" polarity of each of the new horizontal-strings is electrically connected to the "+" input of the DC/DC power transformer and the "−" polarity of each of the new horizontal strings of solar cells is connected to the "−" input of the DC/DC power converter, to thereby form the physical cell-positioning configuration that minimizes the power degradation inflicted by light obstructions upon a substantial portion of at least one row of the solar cells.

According to some other embodiments of the present invention, the N×M physical matrix configuration of solar cells is rearranged by subdividing the physical matrix into two generally equal matrices: a left matrix and a right matrix, wherein the solar cells are arranged in vertical strings. The solar cells of the left matrix are individually rotated 90° counterclockwise and wherein each row of the rotated solar cells are electrically interconnected into new horizontal strings, wherein the solar cells of the right matrix are individually rotated 90° clockwise and wherein each row of the rotated solar cells are electrically interconnected into new horizontal strings. The solar cells are interconnected such that the "+" polarity of each of the new horizontal-strings is electrically connected to the "+" line of the DC/DC power transformer and the "−" polarity of each of the new horizontal strings of solar cells is connected to the "−" line of the DC/DC power transformer, to thereby form the physical cell-positioning configuration that minimizes the power degradation inflicted by light obstructions upon a substantial portion of at least one row of the solar cells.

The power transformer is selected from the group consisting essentially of at least one DC/DC power converter, at least one DC/DC transformer, at least one integrated power converter with at least one DC/DC transformer, or a combination thereof.

The at least one solar array module further includes a multiplicity of high efficiency DC/DC transformers and/or DC/DC power converters and/or a combination thereof, with outputs interconnected in parallel, and electrically connected to the crisscross matrix array of solar cells or to any other type crisscross matrix array of solar cells, wherein each of the at least two high efficiency DC/DC transformers and/or DC/DC power converters is configured to provide a desirable a significantly higher system output voltage.

The at least one solar array module further includes k high efficiency DC/DC power converters, with outputs interconnected in parallel, and electrically connected to the crisscross matrix array of solar cells or to any other type crisscross matrix array of solar cells, wherein the duty cycle of each of the k high efficiency DC/DC power converters is T/k, T being the switching cycle of each of the k high efficiency DC/DC power converters, such that the current pulses produced by each of the k high efficiency DC/DC power converters are timely cascaded within each cycle, and integrate to produce a substantially DC input current.

Optionally and preferably, the current pulses have some overlap, wherein the overlap is zero or higher. Such an overlap facilitates high efficiency of the converters and reduces costs. Optionally, it is possible to operate also with no overlap and even a slip gap between the current pulses.

The at least one solar array module, being a regulated solar array module, further includes an additional DC/DC converter, having a controllable output voltage; a module regulation sub-system, the module regulation sub-system including a module processor; and a voltage monitor for monitoring the output power level of the at least one solar array module, wherein the additional DC/DC converter includes a controller.

The module processor is in communication flow with the voltage monitor to thereby obtain the current output power level, and module processor is also in communication flow with the controller to thereby control the output power level, based on the current output power level. The additional DC/DC converter combines with the at least one high efficiency DC/DC power transformer/converter, to thereby provide a maximum power output of solar module in different light, temperature and other conditions and to maximize solar modules power generation.

The solar power generation system may further include a processor and a voltmeter for monitoring the constant level of output voltage, wherein the additional DC/DC converter includes a controller. The processor is in communication flow with the voltmeter to thereby obtain the current power level of output voltage, and the module processor is in communication flow with the controller to thereby control the constant level of output voltage, based on the current power level of output voltage.

The solar power generation system, being a regulated solar power generation system, further includes a central control system, having a central controller. The regulated solar power generation system includes multiple solar array modules arranged in at least one string of regulated solar array modules. The central controller operatively controls the module processor to control the maximum power output of the respective solar string of modules. The central controller of the central control system also monitors and controls the output voltage of each of the at least one string of regulated solar array modules, to thereby provide a maximum power output of the at least one string of regulated solar array modules in different light, temperature and other conditions.

A preconfigured number of the regulated solar array modules may be electrically connected in series to form a string of solar-array modules, wherein the array of solar-array modules produces a third output voltage level.

The third output voltage level is substantially sufficient to meet the desired application operating voltage level requirement.

A preconfigured number of the strings of solar-array modules are electrically connected in parallel, to form an array of solar-array modules, wherein the array of solar-array modules produces a fourth output power level.

The fourth output power level is substantially sufficient to meet the desired application operating power level requirement.

The DC/DC power transformer/converter includes fast MOSFET transistors or other suitable type of fast switching transistors.

An aspect of the present invention is to provide a system and method that bring each solar-array module to work at its Maximum Power Point (MPP) to maximized power generation.

An aspect of the present invention is to provide a solar system, having a multiplicity of solar-array module, that works at the system MPP and each string of solar system has a same voltage to maximized power generation.

It should be noted that throughout the present disclosure, the invention is described using the text and related drawings. The equations are included only as a possible help to persons skilled in the art, and should not be considered as limiting the invention in any way. Various other equations may be used by persons skilled in the art.

BRIEF DESCRIPTION OF THE DRAWINGS

The present invention will become fully understood from the detailed description given herein below and the accompanying drawings, which are given by way of illustration and example only, and thus not limiting in any way, wherein.

DETAILED DESCRIPTION OF THE INVENTION

The present invention now will be described more fully hereinafter with reference to the accompanying drawings, in which preferred embodiments of the invention are shown. It should be noted that the various types of electrical connections, converters, transformers, solar cells and so forth may optionally be based upon the teachings of previously described PCT Application No. WO/2011/089607 to the extent necessary for a complete, enabling disclosure. This invention may, however, be embodied in many different forms and should not be construed as limited to the embodiments set forth herein; rather, these embodiments are provided, so that this disclosure will be thorough and complete, and will fully convey the scope of the present invention to those skilled in the art.

Unless otherwise defined, all technical and scientific terms used herein have the same meaning as commonly understood by one of ordinary skill in the art to which the present invention belongs. The methods and examples provided herein are illustrative only, and not intended to be limiting.

Figure 4:
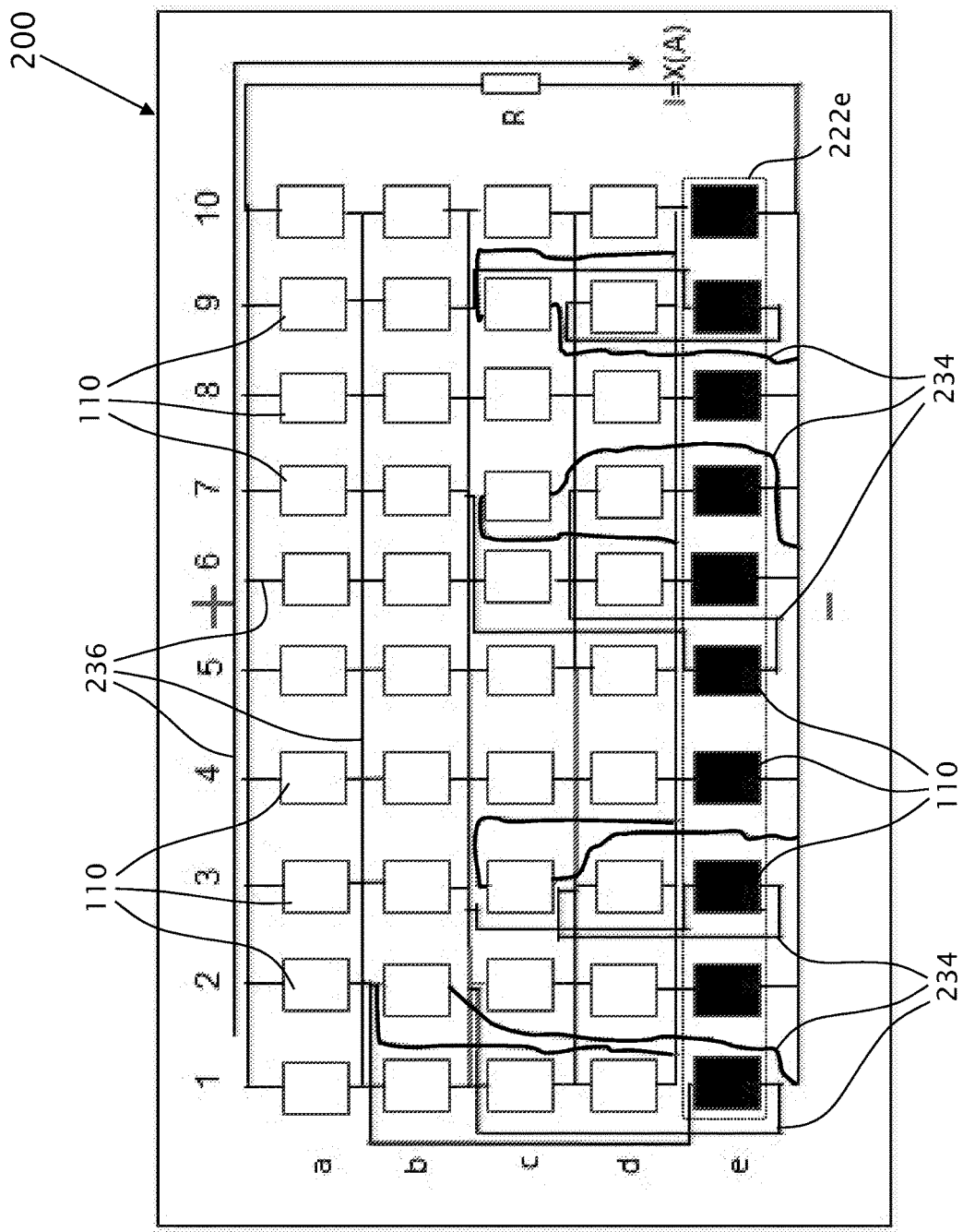
FIG. 4 is a schematic illustration of a solar-array module, wherein the solar cells are illuminated and partially overcast, as shown in FIG. 3, and wherein the solar cells are electrically interconnected in a configuration, according to embodiments of the present invention, to allow currents to bypass malfunctioning solar cells.

Reference is now made to FIG. 4, schematically showing an example solar-array module 200, wherein all solar cells are electrically interconnected in a crisscross matrix configuration, according to variations of the present invention, to allow currents to bypass malfunctioning solar cells. It is known in the art to interconnect columns and rows of solar cells; however, the exemplary embodiment of solar array module 200 shown in FIG. 4 features a plurality of solar cells with at least one solar cell that exchanges the physical location with another solar cell and skips over at least one column or over at least one row, and preferably a combination thereof, without changing the electrical interconnection having a crisscross matrix configuration. In other words, solar array module 200 includes at least one first solar cell that is electrically connected to at least one second solar cell, wherein the at least one first and second cells are not physically located in adjacent rows or adjacent columns, and preferably are located in both a non-adjacent row and a non-adjacent column without changing the crisscross matrix interconnection configuration.

According to the present invention, FIG. 4 shows a solar array module 200 including a plurality of solar cells 110 arranged in an array, featuring a plurality of rows of solar cells 110, labeled in this non-limiting example as rows a-e, and a plurality of columns or strings of solar cells 110, labeled in this non-limiting example as strings 1-10. In the example shown in FIG. 4, solar-array module 200 includes rows 222a-d of solar cells 110 that are illuminated while row 222e is completely overcast. However, solar cells 110 are electrically interconnected in a configuration, according to embodiments of the present invention, such as to allow currents to bypass solar cells 110 that are not generating energy, such as in row 222e. Solar cells 110 in row 222e may optionally be obstructed or overcast, and/or may optionally otherwise be malfunctioning. When one or more solar cells 110 of row 222e are overcast, since one or more of the solar cells 110 of row 222e are shuffled, without changing the crisscross matrix interconnection configuration, the shaded or otherwise malfunctioning physical row of solar cells 110 will not break the electric circuit.

In the non-limiting example shown in FIG. 4, the five physical rows (labeled as "a", "b" . . . "e") and ten physical columns or strings (labeled as "1", "2" . . . "10") of the array of solar cells 110 are electrically interconnected in the following order:

String 1: 1a, 1b, 1c, 1d and 2b.
String 2: 2a, 1e, 2c, 2d and 2e.
String 3: 3a, 3b, 3e, 3d and 3c.
String 4: 4a, 4b, 4c, 4d and 4e.
String 5: 5a, 5b, 5c, 5d and 7c.
String 6: 6a, 6b, 6c, 6d, and 6e.
String 7: 7a, 7b, 5e, 7d and 7e.
String 8: 8a, 8b, 8c, 8d and 8e.
String 9: 9a, 9b, 9e, 9d and 9c.
String 10: 10a, 10b, 10c, 10d and 10e.

Hence, malfunctioning (or shadowed) solar cell 1e is bypassed via solar cell 1b and solar cells 3b-10b; malfunctioning solar cell 2e is bypassed via solar cell 2b and solar cells 3c; 7c, 9c; malfunctioning solar cell 3e is bypassed via solar cells 1c, 2c and/or solar cell 4c, 5c, 6c, 8c, 10c; malfunctioning solar cell 4e is bypassed via solar cells 2b, 3c and solar cells 7c, 9c; malfunctioning solar cell 5e is bypassed via solar cells 1c, 2c, 4c, 5c, 6c and solar cells 8c, 10c; malfunctioning solar cell 6e is bypassed via solar cells 2b, 3c and solar cell 7c, 9c; malfunctioning solar cell 7e is bypassed via solar cells 2b, 3c, 7c and solar cell 9c; malfunctioning solar cell 8e is bypassed via solar cell 2b, 3c, 7c and solar cell 9c; malfunctioning solar cell 9e is bypassed via solar cells 1c, 2c, 4c, 5c, 6c, 8c, 10c; and malfunctioning solar cell 10e is bypassed via solar cells 2b, 3c, 7c, 9c.

Again, malfunctioning refers to the fact that light is obstructed to a particular solar cell or cells 110 and hence that cell or cells 110 cannot generate current.

For the sake of clarity, malfunctioning optionally and preferably refers to the fact that light is obstructed to a particular solar cell or cells 110 and hence that cell or cells 110 cannot generate electric current.

Thus, according to at least some embodiments, at least one solar cell in each row and/or in each column is interconnected to a cell in at least one non-adjacent row and/or column without any changing in base configuration of interconnection of crisscross matrix. Preferably at least one solar cell in each row and in each column is so interconnected. More preferably, a plurality of solar cells in each row and/or in each column is so interconnected. Most preferably, a plurality of solar cells in each row and in each column is so interconnected. For example only, it may be at least 20% of the cells 110 are interconnected; preferably at least 50% are interconnected.

According to example of FIG. 4, a significant part of the power produced by the solar cells 110 in rows a-d is salvaged because solar cells 2b, 3c, 7c and 9c are physically positioned in fully illuminated rows and away from the light obstructed bottom row 122e, without changing the crisscross matrix interconnection This enables the electrical circuit to sustain operation while maintaining the flow of current I. Solar cells 1e, 3e, 5e and 9e, are physically positioned in the light obstructed, bottom row 122e and therefore cannot produce electric energy and current, but the bypassing electrical interconnections enable the rest of electrical circuit to sustain operation while maintaining the flow of current I because the cell crisscross matrix interconnection did not change.

It should be noted that the current flowing through load R due to the illuminated solar cells and the above bypassed electrical interconnections is less than the maximal current, but larger than 0 A, depending on the number of functioning bypassing solar cells 110. Although bypassed, a larger number of functioning bypassing solar cells 110 results in a higher amount of power being produced by solar-array module 200.

Thus, the original physical 5×10 array of solar cells 110 and the electrical crisscross configuration of array 100 are maintained in solar-array module 200.

FIG. 4 shows an optional combination of multiple aspects of embodiments according to the present invention, featuring at least one electrical interconnection between physically directly neighboring (or adjacent) cells 110 and also at least one electrical interconnection between cells 110, which cells 110 are not physically directly neighboring (or adjacent). However, the electrical crisscross configuration of the solar-array module is maintained.

Figure 5:
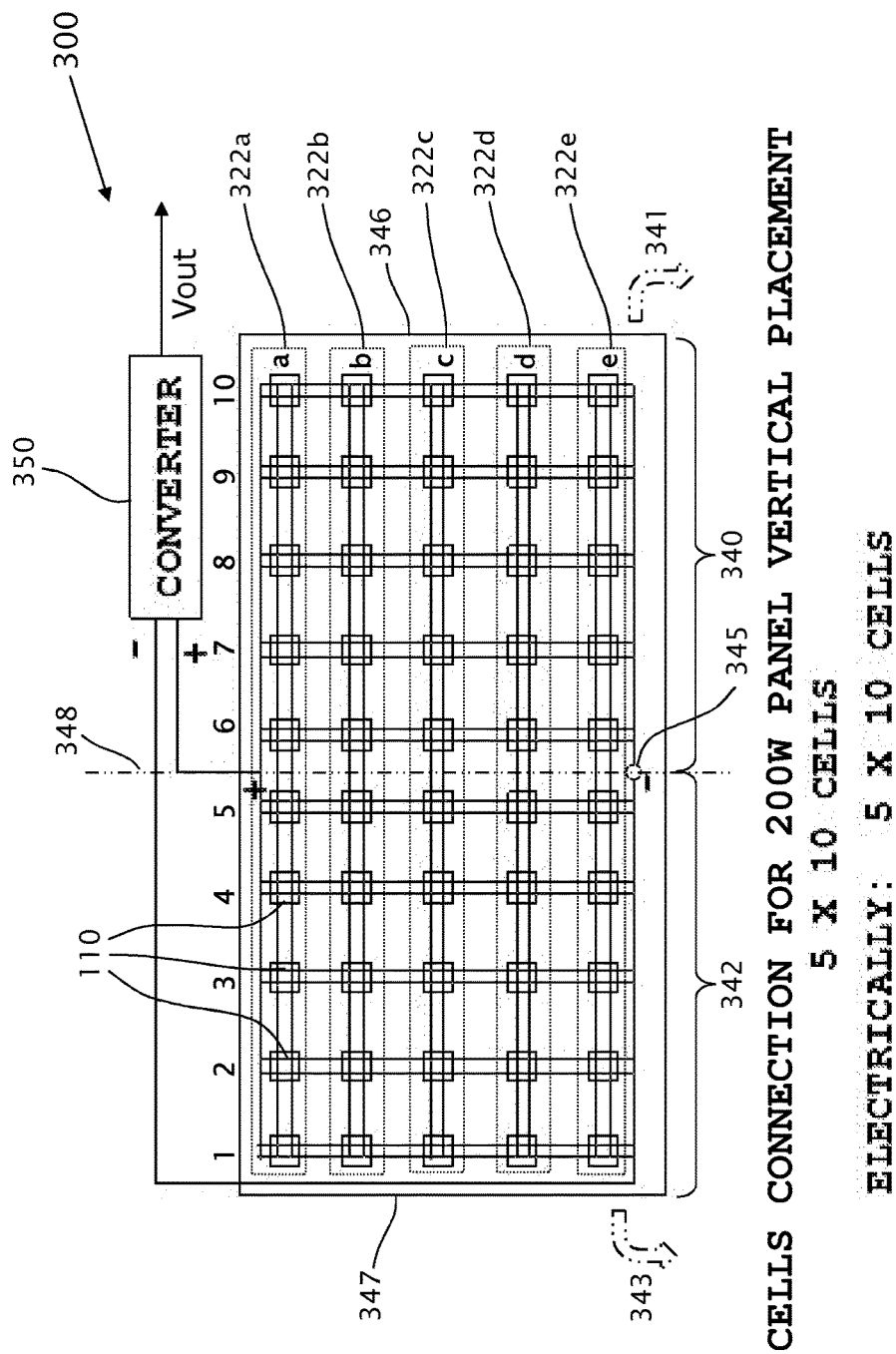
FIG. 5 (prior art) is a schematic illustration showing an example solar-array module, including a crisscross network of solar cells, in a 5×10 solar cells matrix.
Figure 6:
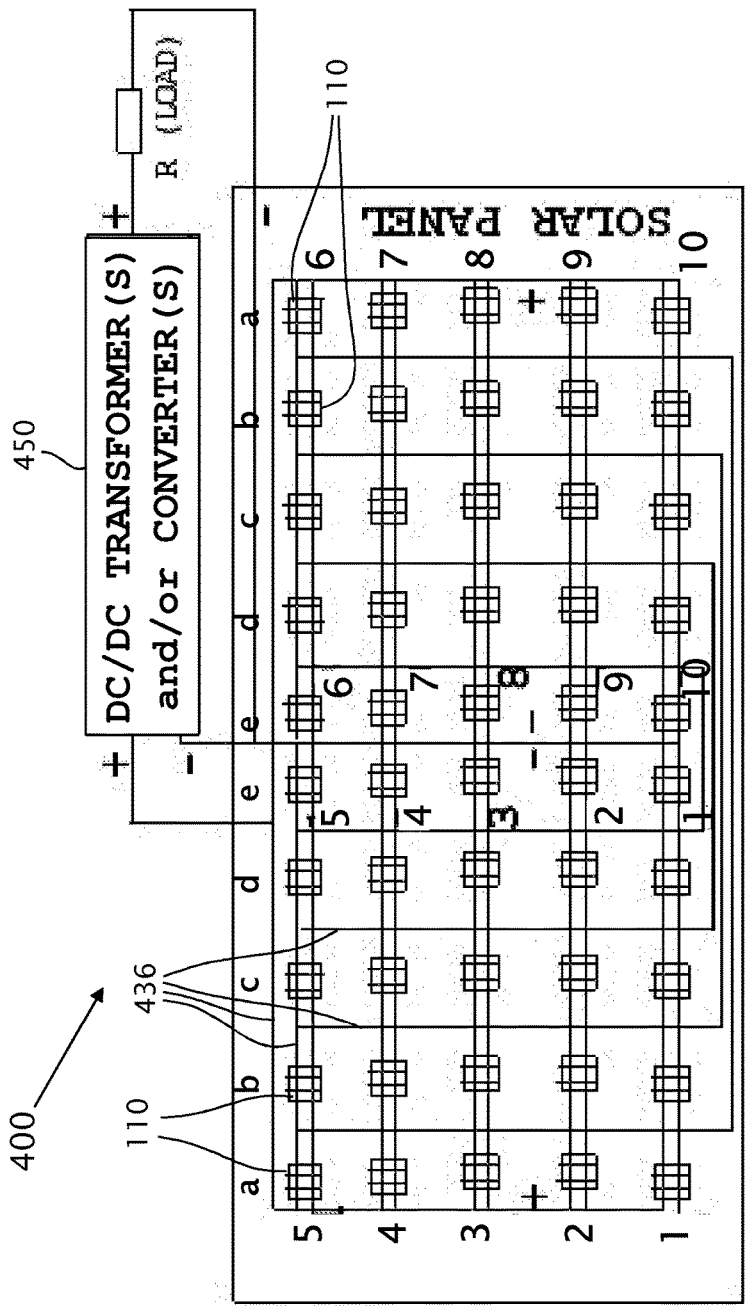
FIG. 6 is a schematic illustration of a solar-array module, wherein the cells are electrically equivalent to the exemplary crisscross matrix configuration shown in FIG. 5, however, the solar cells are disposed in a rotated configuration, according to embodiments of the present invention.

An aspect of the present invention is to provide another physical cell-positioning configuration of the solar cells 110 of a solar-array module. Reference is made to FIG. 5, a schematic illustration showing an example solar-array module 300, including a crisscross network of solar cells 110, configured in a typical 5×10 cell matrix, having strings of cells 1-10 and rows 322a-e. In this example, the number of columns is double the number of rows. Each cell 110 is connected to a cell in an adjacent row and also in an adjacent column. Reference is also made to FIG. 6, a schematic illustration of a solar-array module 400 according to at least some embodiments of the present invention, wherein the interconnectivity of solar cells 110 is electrically equivalent to the exemplary crisscross matrix configuration shown in FIG. 5, however, the strings of solar cells 110 are disposed in a rotated configuration, according to embodiments of the present invention. By "rotated configuration", it is meant that blocks of strings of solar cells 110 are virtually pivoted to a new logical location in the maintained physical matrix, such that the logical location of at least a portion, such as, as a non-limiting example only, at least 50% of solar cells 110, changes. However, their electrical configuration is not altered but rather maintained.

With regard to rotated configuration of the strings of solar cells 110, imagine that the physical matrix of a solar-array module 300 is subdivided into two generally symmetrical sections, a first section 340, including strings of solar cells 6-10 and a second section 342, including strings of solar cells 1-5, along a virtual line 348, as shown. One should imagine that first section 340 is rotated about virtual axis 345 in direction 341 by 90° and second section 342 is rotated about virtual axis 345 in direction 343 by 90°, until edges 346 and 347 of solar-array module 300 are adjacently disposed. The described virtual rotation of first section 340 and second section 342 of art known and shown in FIG. 5 is embodied as solar-array module 400, shown in FIG. 6 and embodying at least some aspects of the present invention. Strings of solar cells 1-5, shown in FIG. 5 in a vertical orientation, are now shown in FIG. 6 as having a horizontal orientation; strings of solar cells 6-10, shown in FIG. 5 in vertical orientation, are now shown in FIG. 6 as having a horizontal orientation.

FIG. 6 shows a solar array module 400 including a plurality of solar cells 110 arranged in a physical array after the above manipulation about the virtual axis. The virtual axis is shown as axis 345 of FIG. 5, which represents a first configuration of the physical array. The second configuration of the physical array, shown in FIG. 6, is determined by symmetrically virtually pivoting a portion (in this non-limiting example, 50% or half) of each of the rows of cells 110 about virtual axis 345, but without changing a plurality of the electrical interconnections 436 between cells 110 (of which only a portion are shown for clarity). This plurality of electrical interconnections 436 comprises a plurality of connections to a plurality of (previously physically) neighboring cells 110 for each of said solar cells 110 as shown. Optionally all of the previously physically neighboring cells 110 are so interconnected in the previously described crisscross implementation.

Thus, the dimensions of the original physical 5×10 array of solar cells 110 and the electrical crisscross configuration of array 300 are maintained in solar-array module 400. However, the electrical wiring layout is reconfigured, compared with array 300, into two portions, each includes a crisscross matrix of solar cells 110:

5*10=2*(5*5).

It should be noted that the electric polarity ("+" & "−") of the solar module may be inverted, in case of first section 340 is rotated about axis 345 (that placed on a upper side of vertical line 348) in reverse by 180° to direction 341 and second section 342 is rotated about axis 345 (that placed on a upper side of vertical line 348) in reverse by 180° to direction 343, until edges 346 and 347 of solar-array module 300 are adjacently disposed.

It should be further noted that the module may be installed, with no limitations, either in horizontal placement or vertical placement, but preferably the strings of cells 1-5 and 6-10 are arranged in a horizontal placement, as shown in FIG. 6, in order to obtain more power output.

Module 400 of FIG. 6 also includes a converter 450 that is preferably provided as a DC-DC transformer/s as shown, with constant duty cycle of 50%/50% because of the higher efficiency, in contrast to the art known configuration, which only features a converter 350, as shown in FIG. 5. Alternatively, a combination between a DC-DC transformer/s and converter/s may be used.

Figure 7:
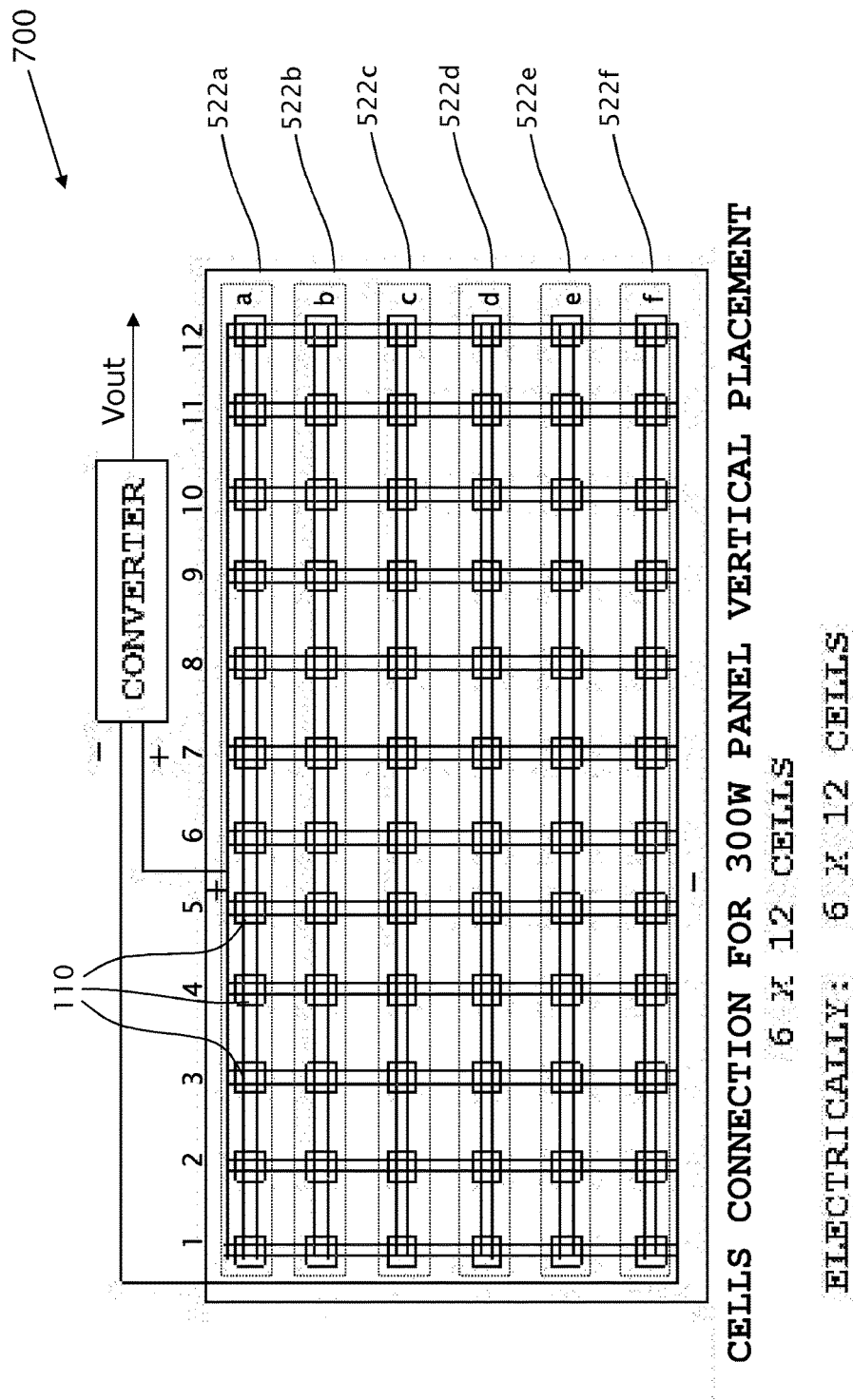
FIG. 7 (prior art) is a schematic illustration showing an example solar-array module, including a crisscross network of solar cells, in a 6×12 solar cells matrix.
Figure 8:
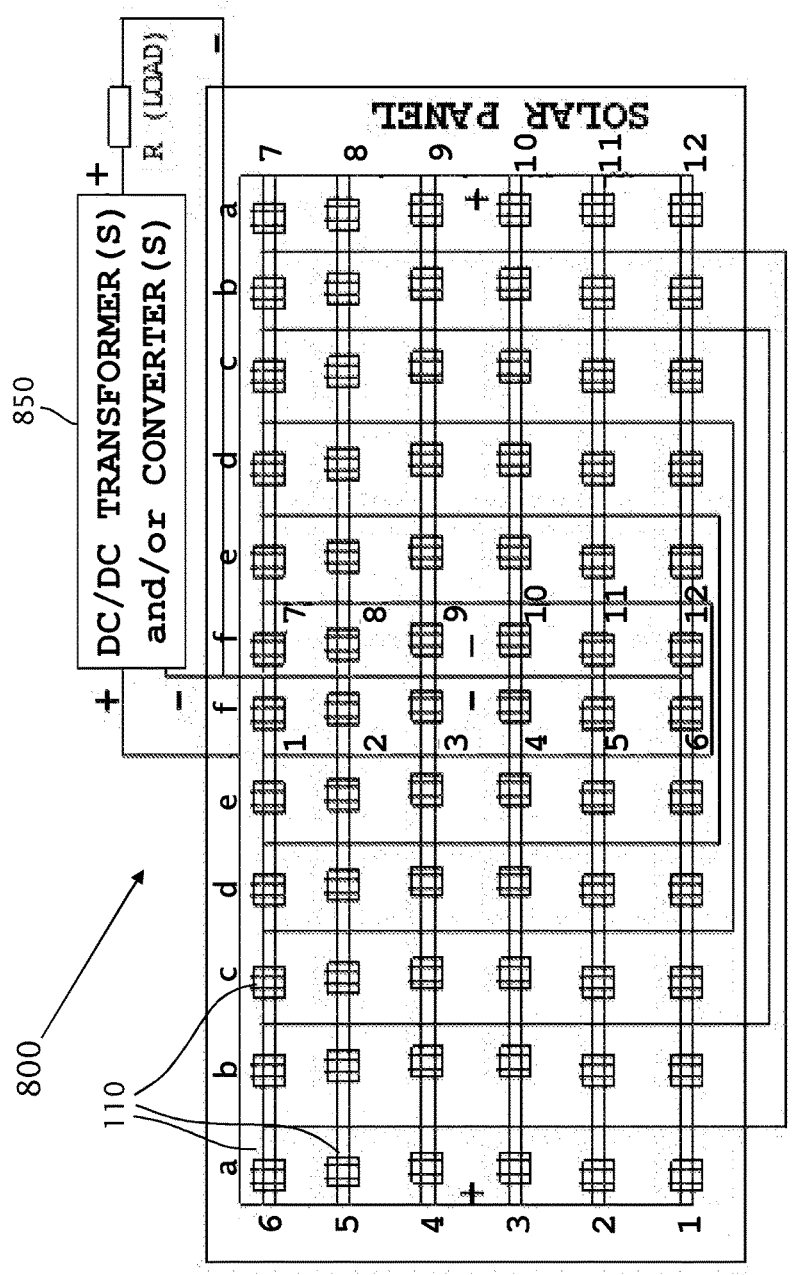
FIG. 8 is a schematic illustration of a solar-array module, wherein the cells are electrically equivalent to the exemplary crisscross matrix configuration shown in FIG. 7, however, the solar cells are disposed in a rotated configuration, according to embodiments of the present invention.

FIGS. 7 and 8 show another configuration pair, in which FIG. 7 represents an art known configuration while FIG. 8 represents an embodiment of the present invention, obtained by altering the logical configuration of cells 110.

Similarly, FIG. 7 is a schematic illustration showing an example solar-array module 700, including a crisscross network of solar cells 110, configured in a 6×12 cell matrix, having strings of cells 1-12 and rows a-f. In this example, the number of columns is double the number of rows. FIG. 8 is a schematic illustration of a solar-array module 800, wherein the interconnectivity of solar cells 110 is electrically equivalent to the exemplary crisscross matrix configuration shown in FIG. 7, however, the strings of solar cells 110 are disposed in a logically rotated configuration, according to variation embodiments of the present invention. FIGS. 7 and 8 illustrate similar principles as the described above, with regards to respective FIGS. 5 and 6. Again solar array module 800 of FIG. 8 features a converter 850 that may also preferably be, with no limitations, a DC-DC transformer/s, in contrast to the art known configuration, which only features a converter. Alternatively, a combination between a DC-DC transformer/s and converter/s may be used.

It should be further noted that the module may be installed, with no limitations, either in horizontal placement or vertical placement but in horizontal module placement it is preferably to put the strings 1-6 and 7-12, in a horizontal placement as shown in FIG. 8, in order to obtain more power output, as previously described.

Thus, the dimensions of the original physical 5×10 array of solar cells 110 and the electrical crisscross configuration of array 700 are maintained in solar-array module 800. However electrically, the array is reconfigured in two portions of cells matrices:

6*12=2*(6*6).

It should be noted that the electric polarity ("+" & "−") of the solar module may be inverted.

Figure 9:
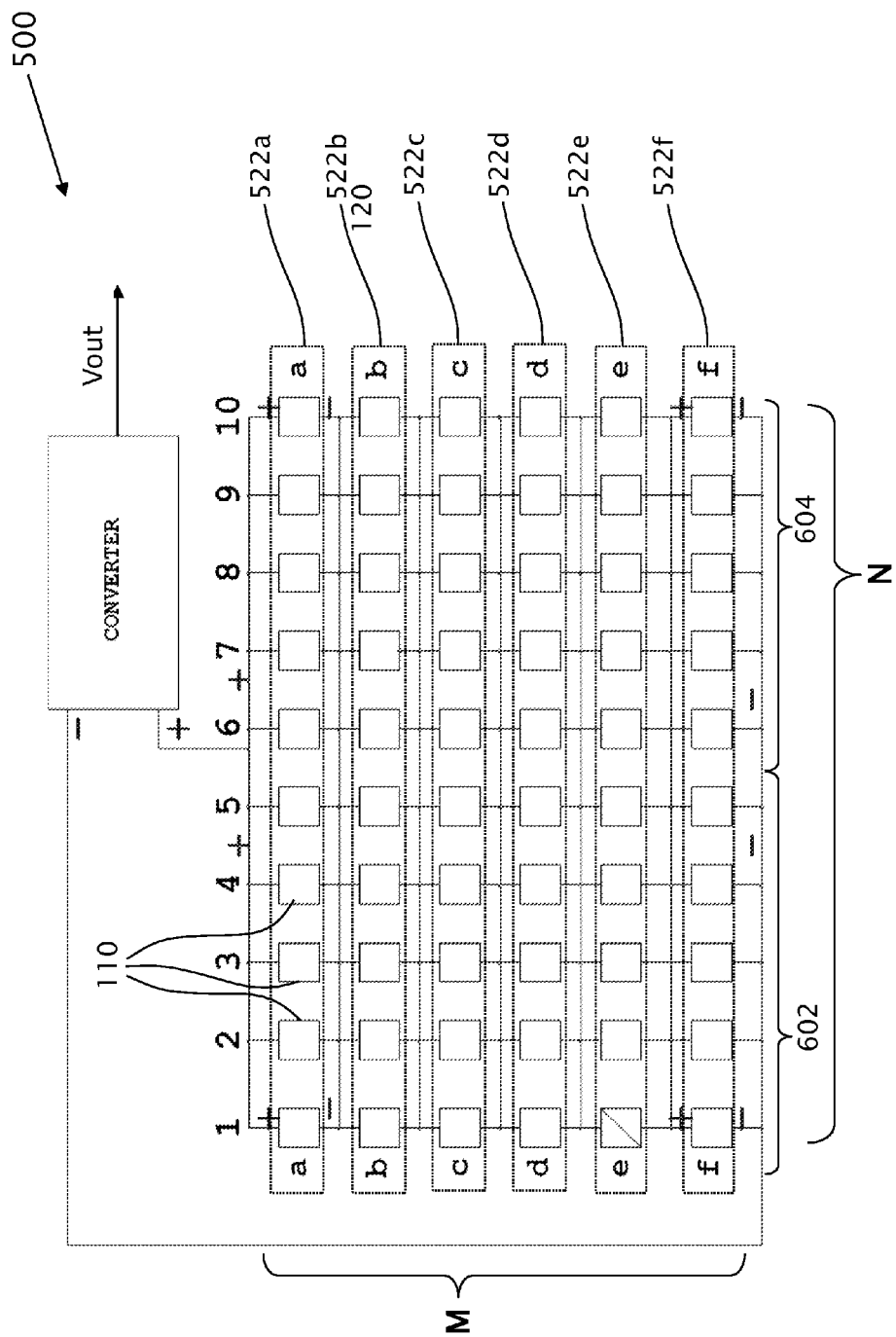
FIG. 9 (prior art) is a schematic illustration showing an example solar-array module, including a crisscross network of solar cells, in a 6×10 solar cells matrix.

FIG. 9 is a schematic illustration showing an example solar-array module 500, including a crisscross network of solar cells 110, configure in a 6×10 cell matrix, having strings of cells 1-10 and rows 522a-f. Again, as for FIGS. 5 and 7, the respective solar cells 110 are arranged such that they are electrically connected to a cell in an adjacent row and in an adjacent column in a crisscross matrix configuration.

Figure 10:
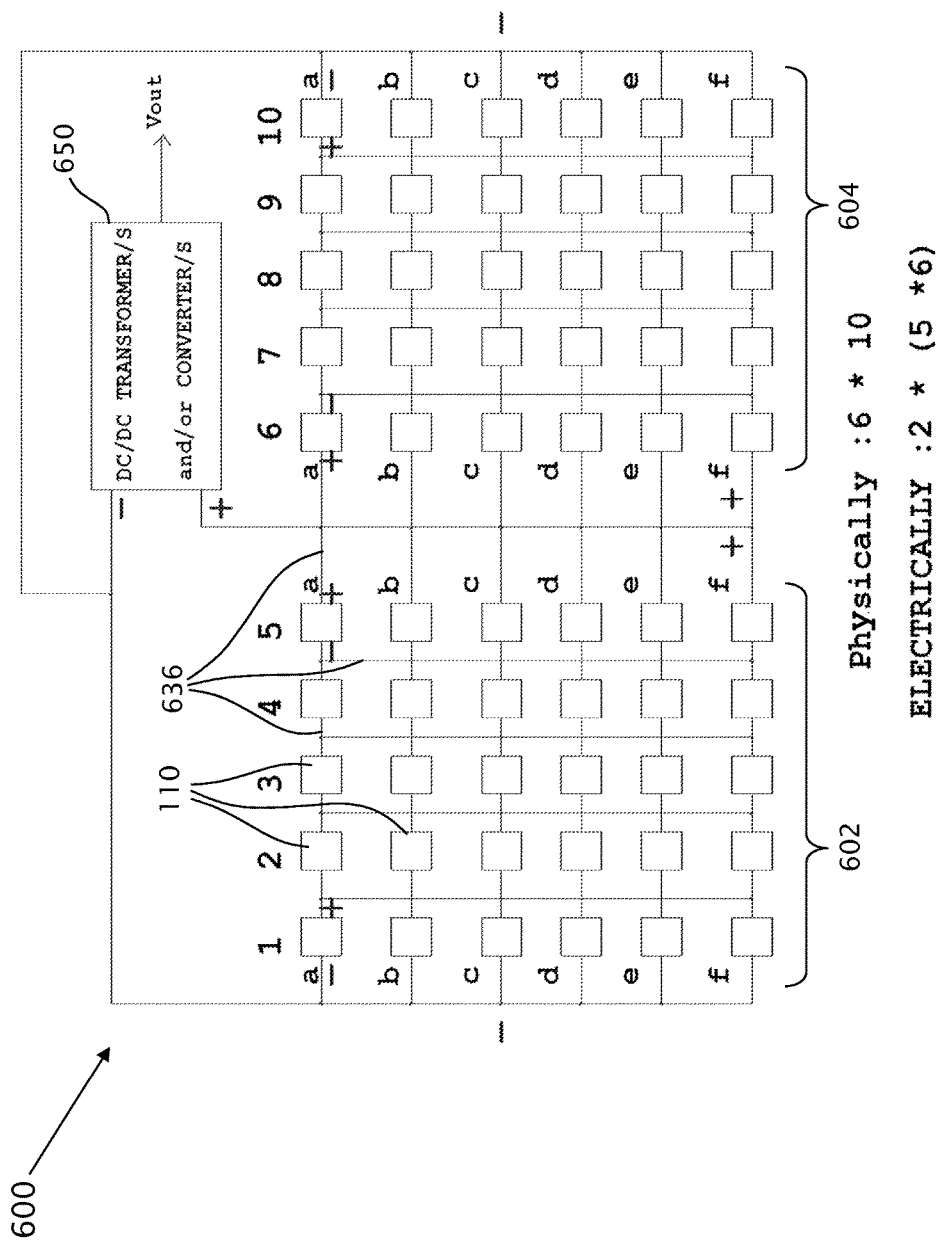
FIG. 10 is a schematic illustration of a solar-array module, wherein the cells are electrically equivalent to the exemplary crisscross matrix configuration shown in FIG. 9, however, the solar cells are disposed in a rotated configuration, according to embodiments of the present invention.

FIG. 10 is a schematic illustration of a solar-array module 600, wherein the interconnectivity of solar cells 110 is electrically equivalent to the exemplary crisscross matrix configuration shown in FIG. 9, however, the strings of solar cells 110 are disposed in a logically rotated configuration, according to still other variation embodiments of the present invention.

In the a schematic illustration shown in FIG. 9, the array of solar cells 110 includes N×M solar cells 110, wherein N is the number of columns and M is the number of rows. The array (500) is subdivided into two symmetrical portions, along the N axis. In the example embodiment shown in FIG. 10, N=10 and M=6, meaning that the number of the N×M array of solar cells 110 in the array of this example is 60.

The array (500) is subdivided into two symmetrical portions, according to:

$$N \times M = \frac{N}{2} * M * 2,$$

and in the particular example of FIGS. 9 and 10:

$$10 * 6 = \frac{10}{2} * 6 * 2 = 2 * (5 * 6).$$

Hence, the electrical configuration includes two matrices of 30 solar cells 110 each: 2*(5*6), matrix 602 includes columns 1-5 and rows a-f; and matrix 604 includes columns 6-10 and rows a-f. Then, the individual solar cells 110 are rotate 90° (relative to cells position in FIG. 9), such that the (+) polarity of each solar cells 110 is connected to the (+) line of converter 650 and the (−) polarity of each solar cells 110 is connected to the (−) line of converter 650.

Thus, the dimensions of the original physical 6×10 array configuration of array 500 is maintained in solar-array module 600, however the electrical wiring layout is reconfigured and the crisscross matrix interconnections configuration of solar cells 110 is maintained also.

Again, solar cells 110 are preferably connected through electrical interconnections 636, of which only a few are shown for clarity; furthermore, again preferably electrical interconnections 636 are the same as for FIG. 9, even though at least a portion (in this example half) of cells 110 have changed physical locations. Again, solar array module 600 features a converter 650 that is also preferably a DC-DC transformer/s, in contrast to the art known configuration, which only features a converter.

It should be noted that the electric polarity ("+" & "−") of the module may be inverted, wherein the polarity of the individual solar cells 110 is also changed by repositioning the cells by 180 degrees.

It should be further noted that rows and columns within each of the two matrices 602 and 604, maybe exchanged.

Typically, the configuration of a solar-array module is selected according adaptive to the electric output needs, land topography, geographical location, tilting-angle of a solar-array module, economic considerations, and other considerations. The tilting angle of the module relates to the angle of the panel with regard to the ground.

The modules shown in FIGS. 6, 8 and 10 are shown by way of example only, with no limitations. However, all the solar cells 110 in the modules of the present invention are configured in a crisscross network configuration.

It should be noted that solar-array modules 400 and 800, are shown in horizontal placement, in which case when the bottom row(s) of the solar-array module is overcast, the overcast solar cells 110 do not produce any power. However, the rest of solar cells 110 continue to produce power and supply that power to input of the connected transformer/s or converter/s. For example, when the bottom row(s) of solar-array module 600 is overcast, only the overcast solar cells 110, that is cell-strings 1 and 10 (FIG. 6) and cell-strings 6 and 7 (FIG. 8) do not produce any power. Hence, 8 out of the 10 cell-strings of FIG. 6 and 10 out of 12 of FIG. 8 continue to function and produce about 80% of the solar-array module full capacity It should be further noted that solar-array module 600 is shown in horizontal placement, in which case when the bottom row(s) of the solar-array module is overcast, the overcast solar cells 110 do not produce any power. However, the rest of solar cells 110 continue to produce power and supply that power to input of the connected transformer/s or converter/s. For example, when the bottom row(s) of solar-array module 600 is overcast, only the overcast solar cells 110, that is cell-row f does not produce any power. Hence, 5 out of the 6 cell-rows continue to function and produce about 80% of the solar-array module full capacity.

According to at least some embodiments of the present invention the solar cells-array is optionally connected to the input of one or more converters, such as DC/DC converter (Up Converter), to one or more transformers such as a DC/DC transformer, a combined converter/DC-DC transformer as shown in several of the previously described figures, a boost-converter, a step-up-converter (see FIGS. 11 and 12) or any other converter topologies that converts the input solar cells array (having a crisscross network configuration) voltage level to a significantly higher output voltage level, since the output power is high, a number of converters and/transformers may be needed, for higher efficiency.

Figure 11:
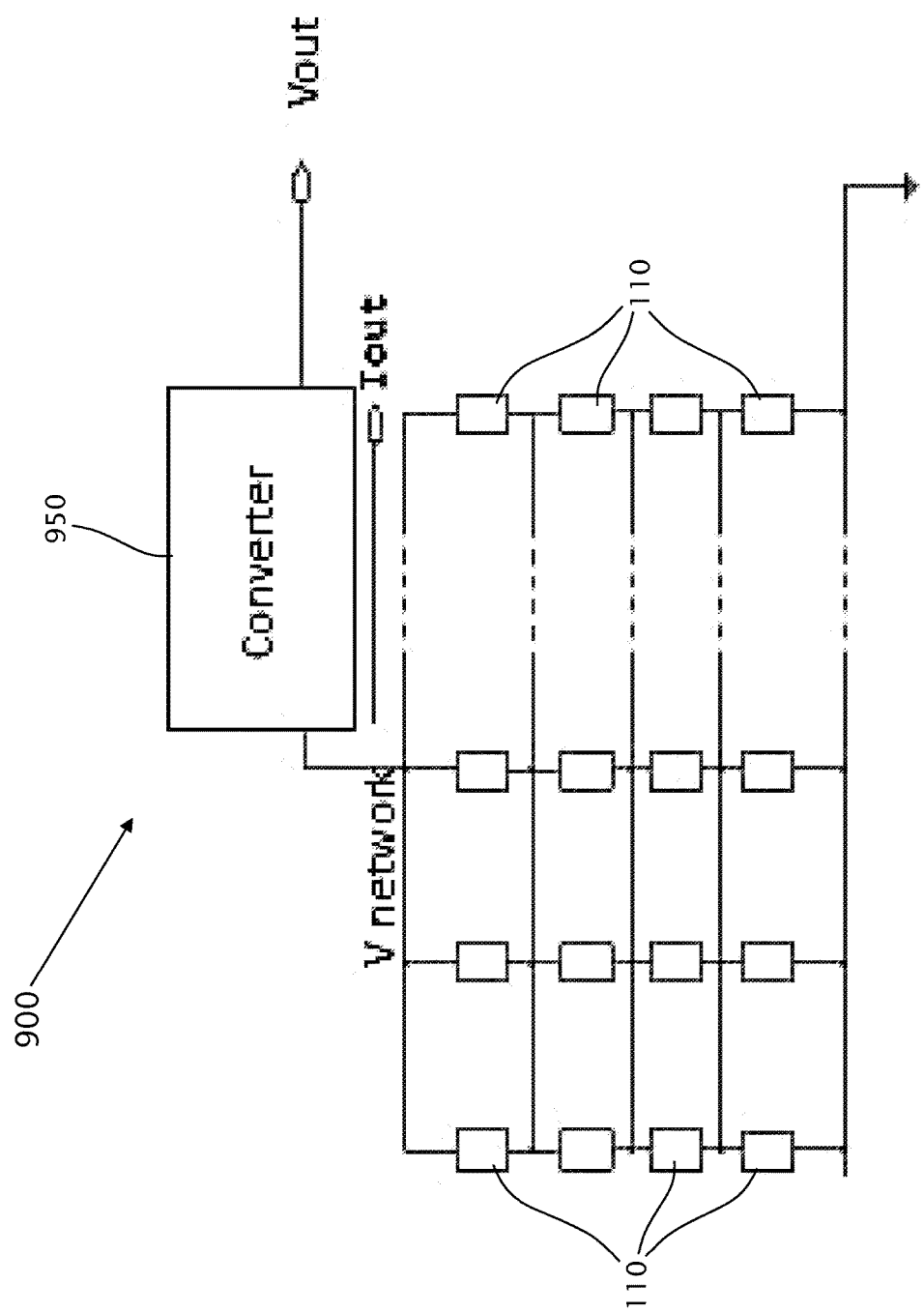
FIG. 11 (prior art) is a schematic illustration showing an example solar-array module, including a crisscross network of solar cells and a converter, connected at the exit of the array of solar cells.
Figure 12:
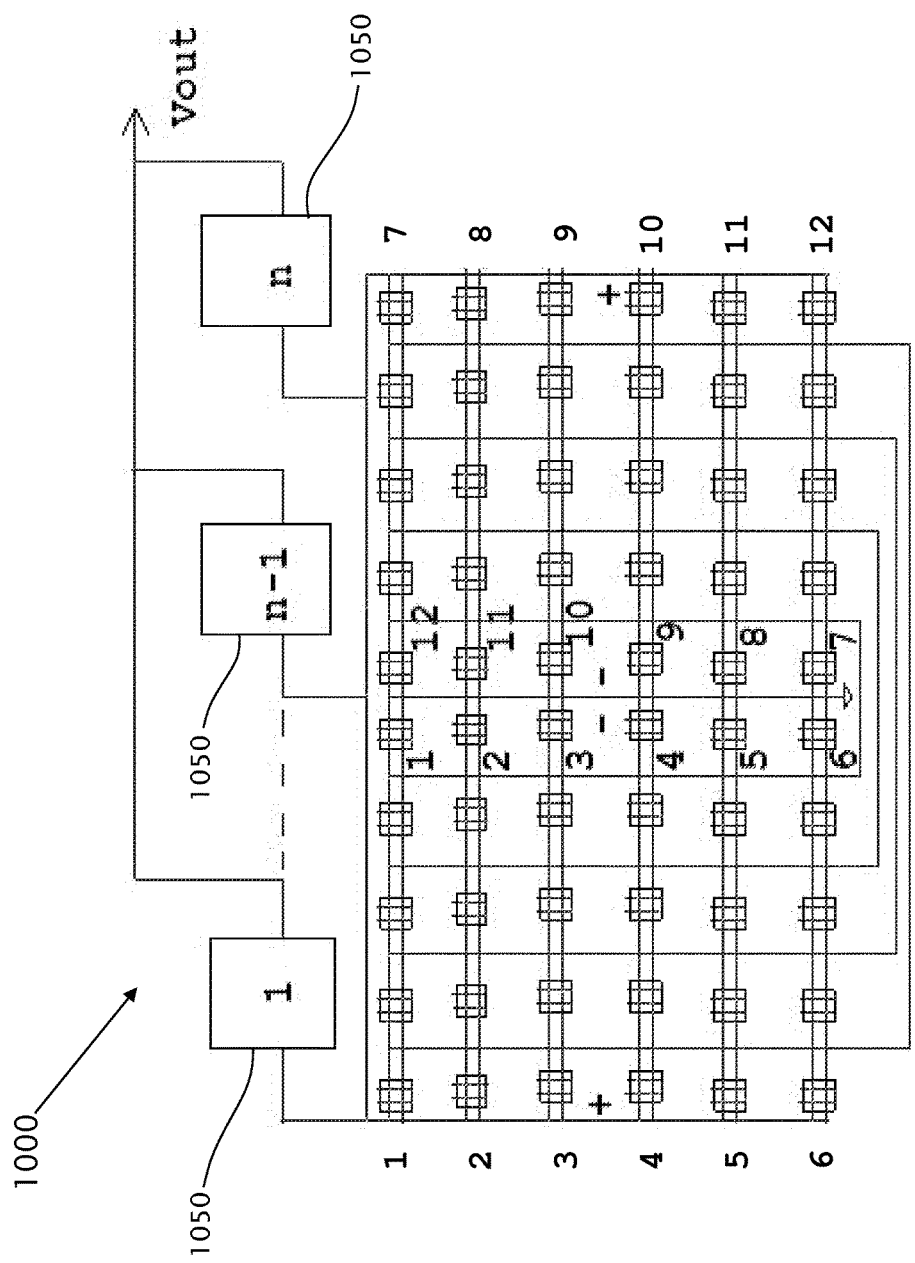
FIG. 12 is a schematic illustration showing an example solar-array module, including a crisscross network of solar cells and n converters and/or n DC/DC transformers, connected at the exit of the array of solar cells, which converters converts the input voltage level to a significantly higher output voltage level, according to variations of the present invention.

FIG. 11 (prior art, as shown in previously described PCT Application No. WO/2011/089607) is a schematic illustration showing an example solar-array module 900, including a crisscross network of solar cells 110, and a converter 950, connected at the exit of the array of solar cells 110, which converter 950 converts the input voltage level to a significantly higher output voltage level, for example from 3V to 30 Volts. FIG. 12 is a schematic illustration showing an example solar-array module 1000, including a crisscross network of solar cells 110, and n DC/DC transformers or n converters 1050, connected at the exit of the array of solar cells 110, which converters 1050 converts the input voltage level to a significantly higher output voltage level. The electrical connections of solar cells 110 are arranged in a one of arrays of present invention as previously described.

Figure 13:
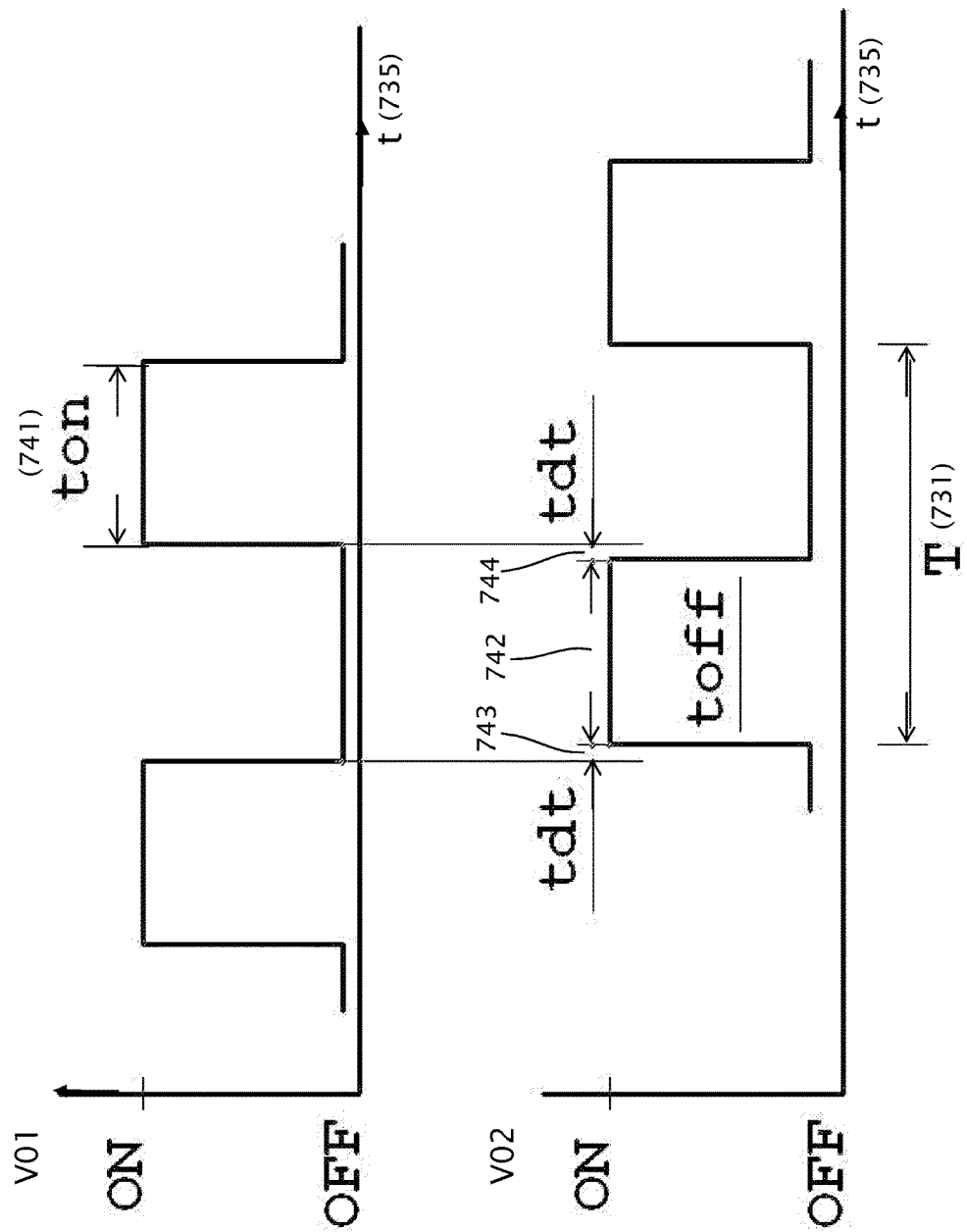
FIG. 13 (prior art) is a diagram of switching times of a power converter or DC/DC transformer, in conjunction with solar-array modules, working at a operational constant and just less than 50%/50% duty cycle.

FIG. 13 shows a diagram of switching times of a power converter operating in conjunction with solar-array modules described herein; such a power converter may optionally operate as shown in previously described PCT Application No. WO/2011/089607. The solar-array includes solar cells connected in a crisscross configuration. The operational duty cycle of a switching DC/DC transformer that works in a constant frequency, is constant and is optionally and preferably just less than 50% (almost 50%, for example only, such as any of 48% or 49%, or 49.9% (or other values between 48% and just below 50%, or between 49% and just below 50%, such as up to 49.9% and just below 50% and more, etc.). Similarly a switching DC/DC transformer is based on a push/pull topology, and thereby each shoulder works at constant and almost 50% duty cycle of a switching period and together form pulses that work at a 50%/50% duty cycle.

In variations of the present invention, in conjunction with solar array FIG. 6, 8, 10 and other networks, FIG. 13 details switching times of a power converter, showing the control voltage for the MOSFET transistors (or other type of transistors) vs. time 735, wherein the power converter may be a switching DC/DC transformer/s, a boost converter/s or any other type of power conversion topology, operating with duty cycle of 50%/50%. The ON time 741 of the MOSFET transistors (or any other suitable transistors) in FIG. 13 is almost 50%, for example only, such as any of 48% or 49% or 49.9% or more. The OFF time 742 of the MOSFET transistors in FIG. 13 is almost 50% also. Hence, the operational duty cycle of the MOSFET transistors is constant and is just less than 50% (almost 50%, such as any of 48% or 49%, or 49.9% and more, as previously described), wherein the duty cycle is defined as:

Duty cycle=ON time(741)/T(731).

The "dead" time 743 between the switching time ON to OFF of one MOSFET transistor, and the switching OFF to ON of the other MOSFET transistor is a very, very small time relating to the ON and OFF time periods, in order to prevent both MOSFET transistors from conducting simultaneously. As a non-limiting example only, dead time 743 may optionally be any value between 0% and 2%, preferably between 0.01% and 1%. The same consideration applies to the "dead" time 744 which may optionally have the above values as for dead time 743. Through the transformer flows a current which is only interrupted just in very small "dead" time intervals 743 and 744. This power converter is a DC/DC transformer with small input voltage and high output voltage (for example only, 3V input voltage and 36V output voltage). Because the current switching time is very close to 100% (for example only, ton=49.9% and toff=49.9%), a very small current interrupt occurs for "dead" time intervals 743 and 744, greatly reducing the ripple in the power converter input and output circuits. In other words the current flowing during each switching period may nearly be characterized as DC current, which reduces the ripple greatly.

In variations of the present invention, a multiplicity of DC/DC transformers or boost converters, or a combination thereof, or any other type of power conversion topology are used, operating with duty cycle substantially less than 50%/50%. However, by operating together, do achieve a duty cycle that is may be just less than 50% or even more than 50% but with an small overlap, say for example only for working frequency of 50 kHz of 0.1-1 microseconds between pulses. For example, as previously described, there may optionally be provided four push-pull converters, one having a duty cycle of at least 25%/75%. Optionally, there may be some overlap between pulses of the converters. As another non-limiting example only, the transformers or converters may optionally comprise three push-pull converters, each having a duty cycle of at least 33.4%/66.6%. Again optionally, there may be some overlapping among pulses of the three converters.

Figure 14:
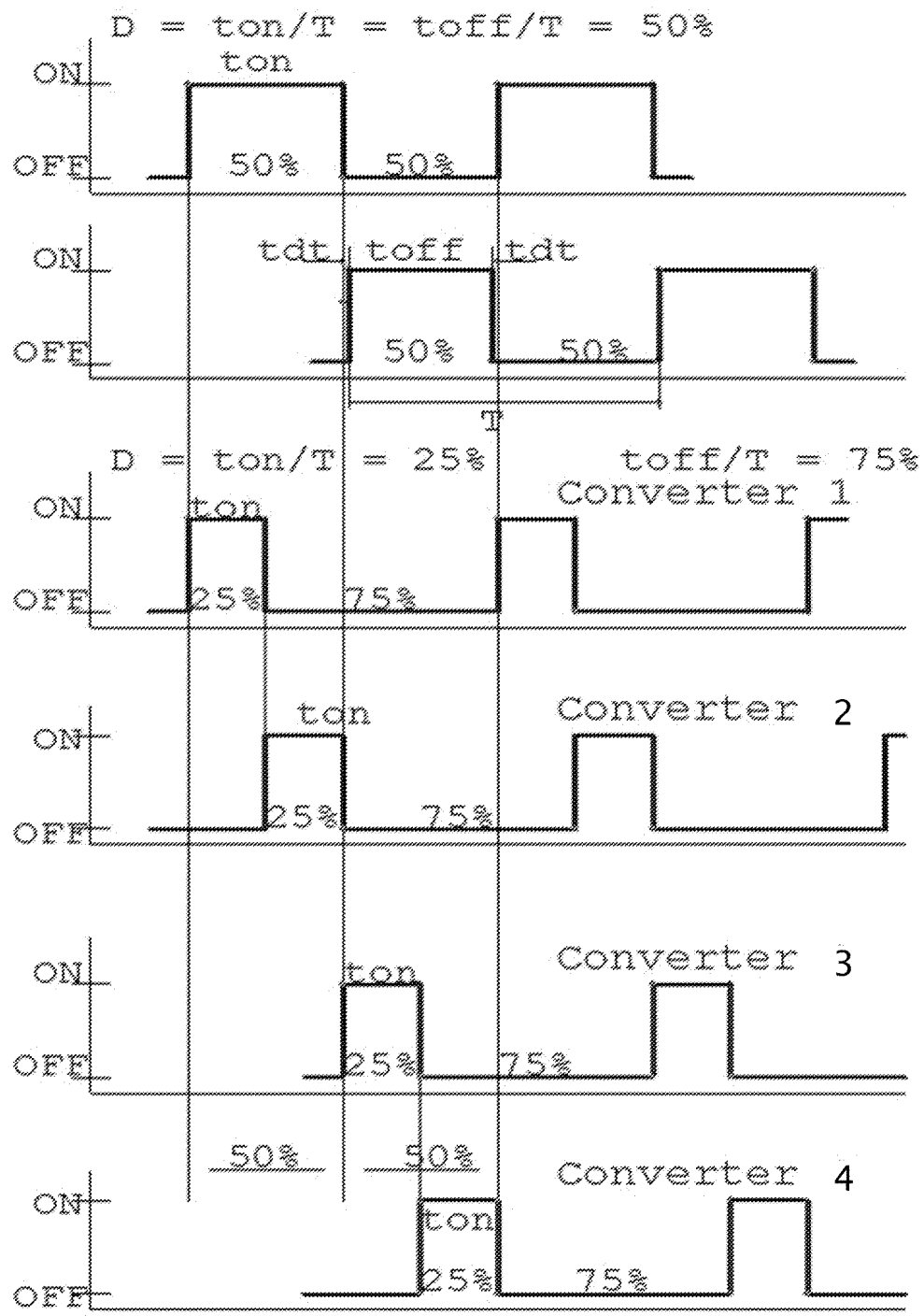
FIG. 14 is a diagram of switching times of four power converters or four DC/DC transformers, in conjunction with solar-array modules, working at a duty cycle of 25%/75%, according to embodiments of the present invention.

Similarly, one can use any number of push-pull converters. However, in all cases, the converter circuits operate according to synchronized timing with some phase shift. FIG. 14 is a diagram of exemplary switching times of four power converters, in conjunction with solar-array modules, working at a duty cycle of 25%/75% without overlap.

Figure 15:
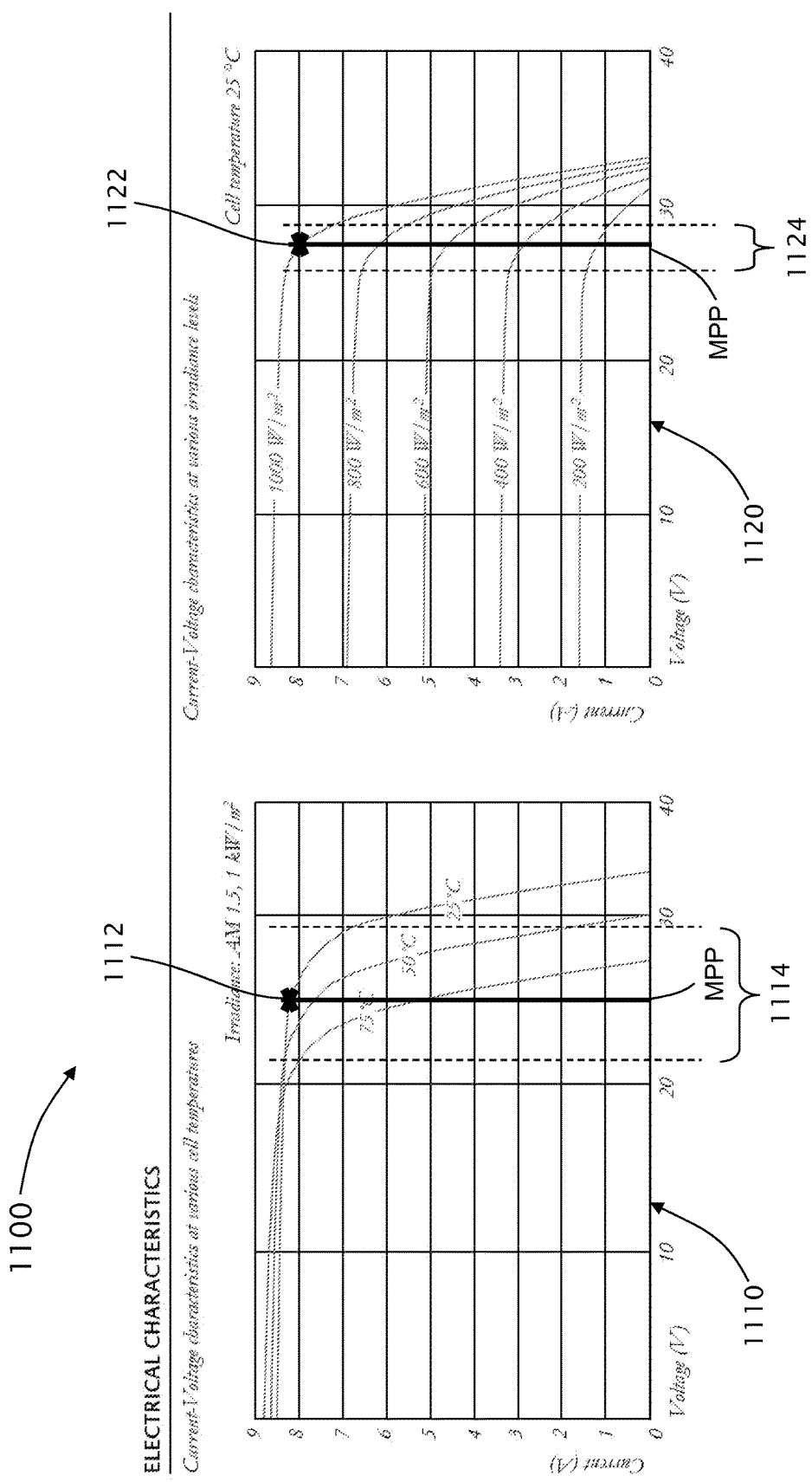
FIG. 15 (prior art) is a typical solar array module current-voltage characteristics as various cell temperature and various irradiance levels, including voltage range of maximum power point regulation zone.

The power produced by a solar array system is affected by the cell temperature, the load on the system and the level of irradiance, as shown in FIG. 15 for typical prior art arrays. FIG. 15 depicts two graphs of a solar module: current-voltage characteristics at various cell temperatures graph 1110 and current-voltage characteristics at various irradiance levels graph 1120. In each of the graphs, the current remains generally steady as the voltage increases, until dropping down sharply at a certain voltage level, forming a knee-shaped curvature. The inflection point of the knee is the Maximum Power Point (MPP). For example, at a radiance level of 1000 W/m$^2$, the MPP is marked by point 1122 (approximately 28V); and at a temperature of 25° C., the MPP is marked by point 1112 (approximately 25V). Hence, if the irradiance level and/or the temperature are changed, the MPP changes and the output power changes. If the irradiance level and/or the temperature change to less optimum values, the output power decreases.

Figure 16:
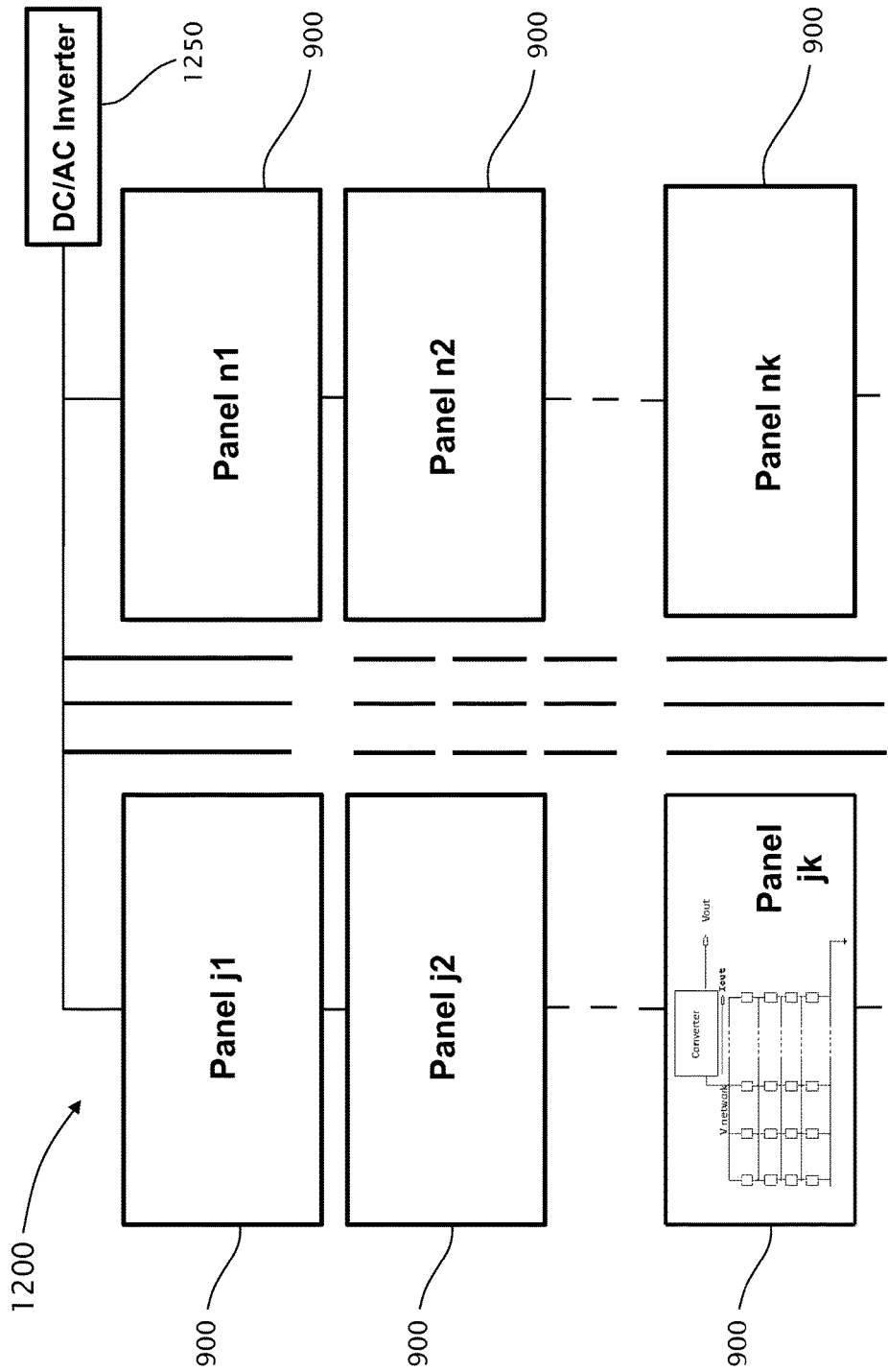
FIG. 16 (prior art) is a schematic illustration showing an example solar-array system, having plurality of modules, each including a crisscross network of solar cells and n converters and/or n DC/DC transformers, connected at the exit of the array of solar cells, wherein the system includes a DC/AC inverter.

To deal with the problem of loss of power as a result of a changing MPP due to changing conditions of irradiance level (that is, access of the solar cells to light) and/or temperature, a DC/AC inverter, having a MPP-tracer, is used, as shown in FIG. 16. FIG. 16 is a schematic illustration showing an example solar-array system 1200, having for example n*k solar-array modules 900, each including a crisscross network of solar cells 110, organized as is known in the art with cells connected to those in adjacent rows and columns, and wherein the system includes a DC/AC inverter 1250. However, this solution works at a solar system level and not at a solar-array module level. Thus, this solution does not enable each solar-array module to operate at its MPP, which would provide greater efficiency over the entire system.

Figure 1:
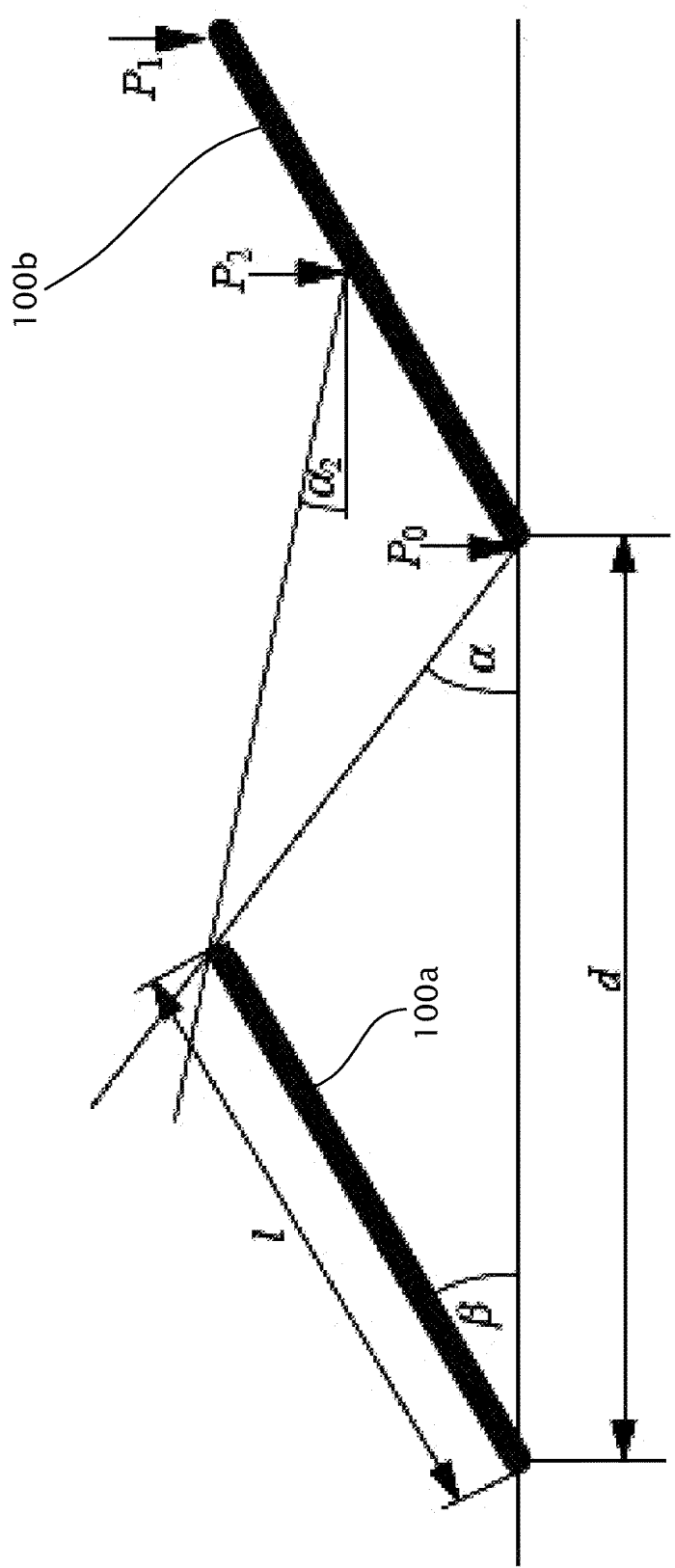
FIG. 1 (prior art) is a schematic illustrates a geometry of tilted solar array modules of a solar-system, tilted at an angle $\beta$, wherein a first solar-array module casts a shadow on a portion of a second solar-array module.
Figure 2:
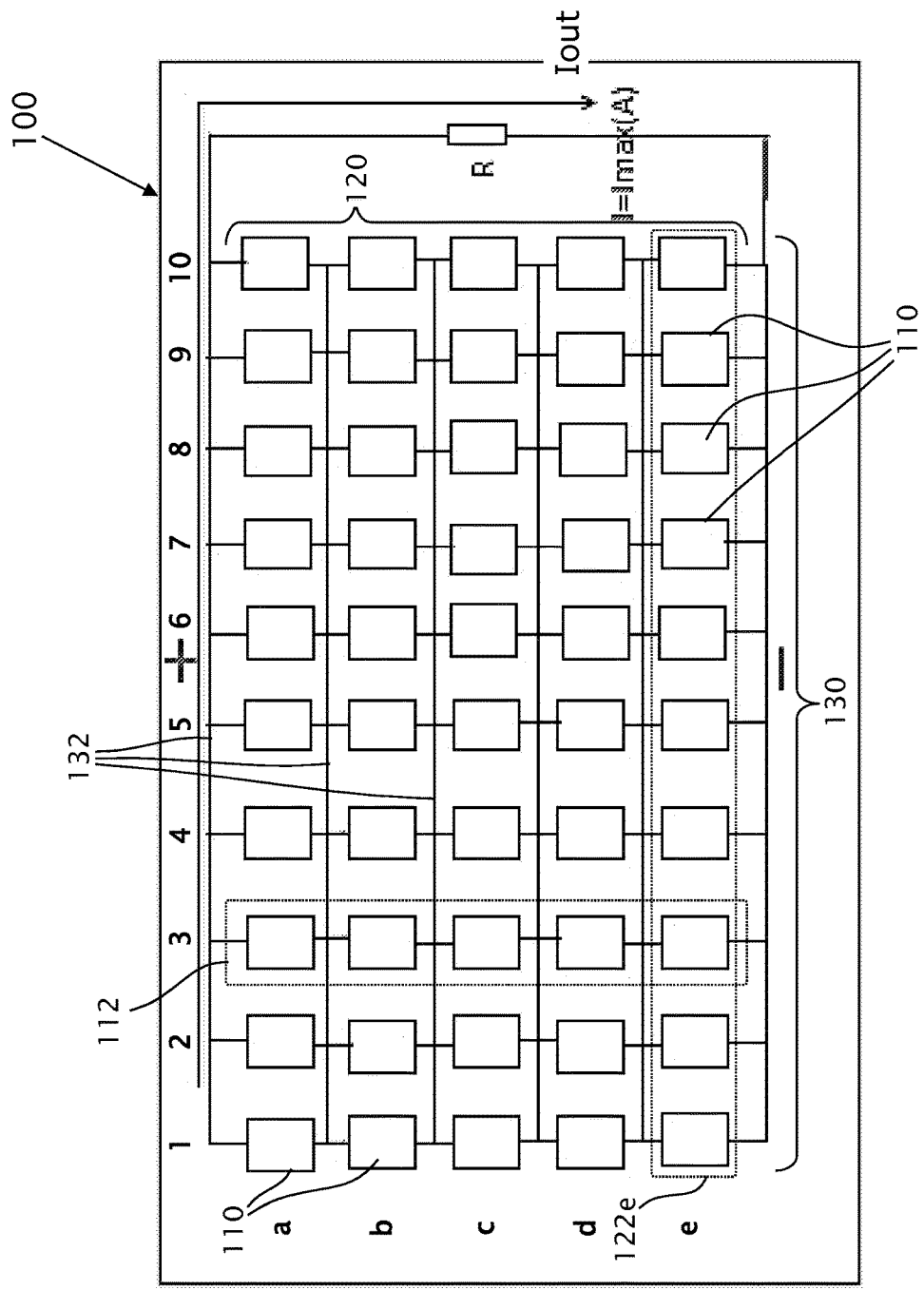
FIG. 2 (prior art) is a schematic illustration showing an example solar-array module, including crisscross network of solar cells.
Figure 3A:
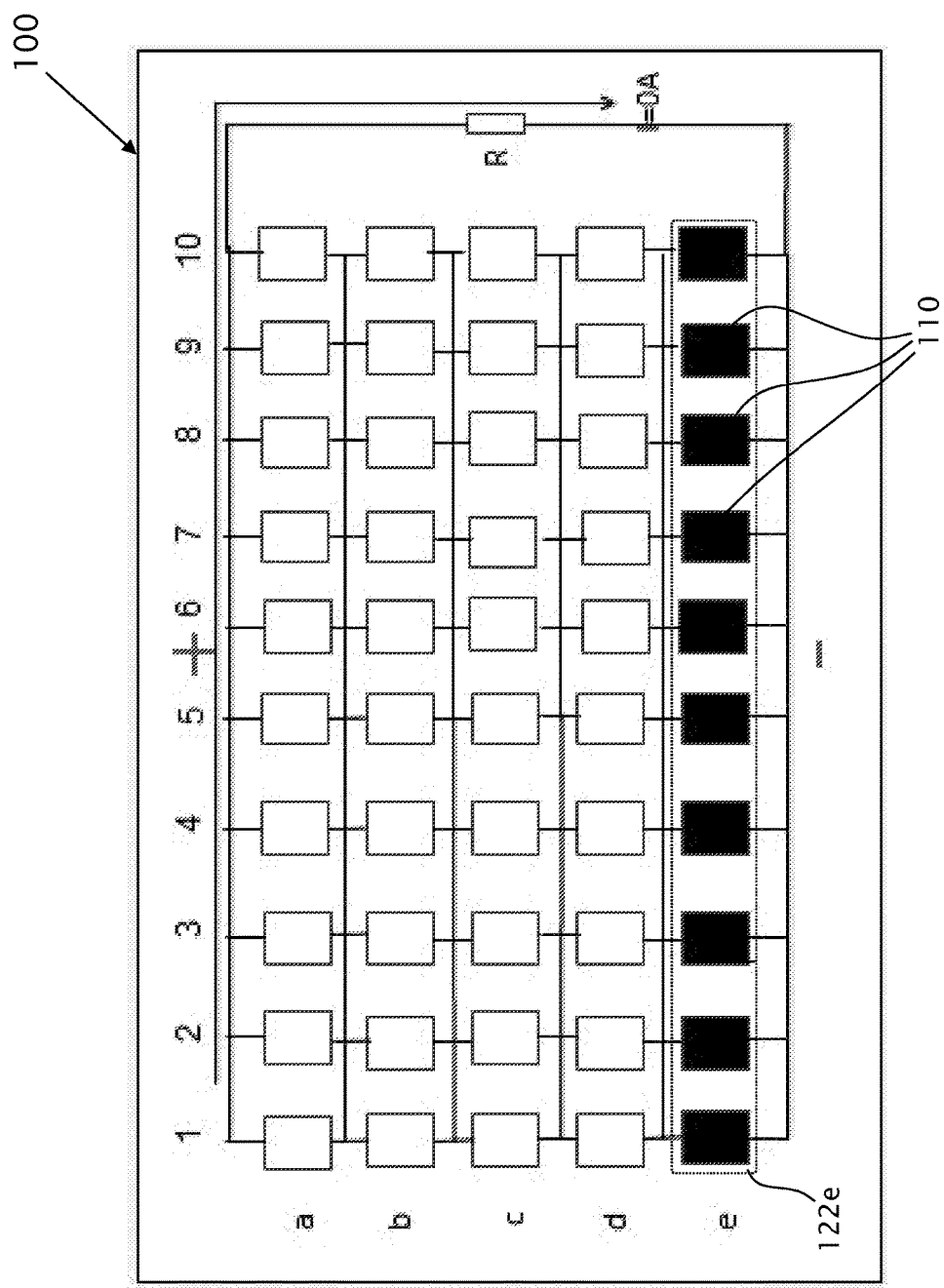
FIG. 3a (prior art) is a schematic block diagram showing the solar-array module shown in FIG. 2, wherein the solar cells in the lower row of cells are obstructed such that reduced or no light reaches them.
Figure 3B:
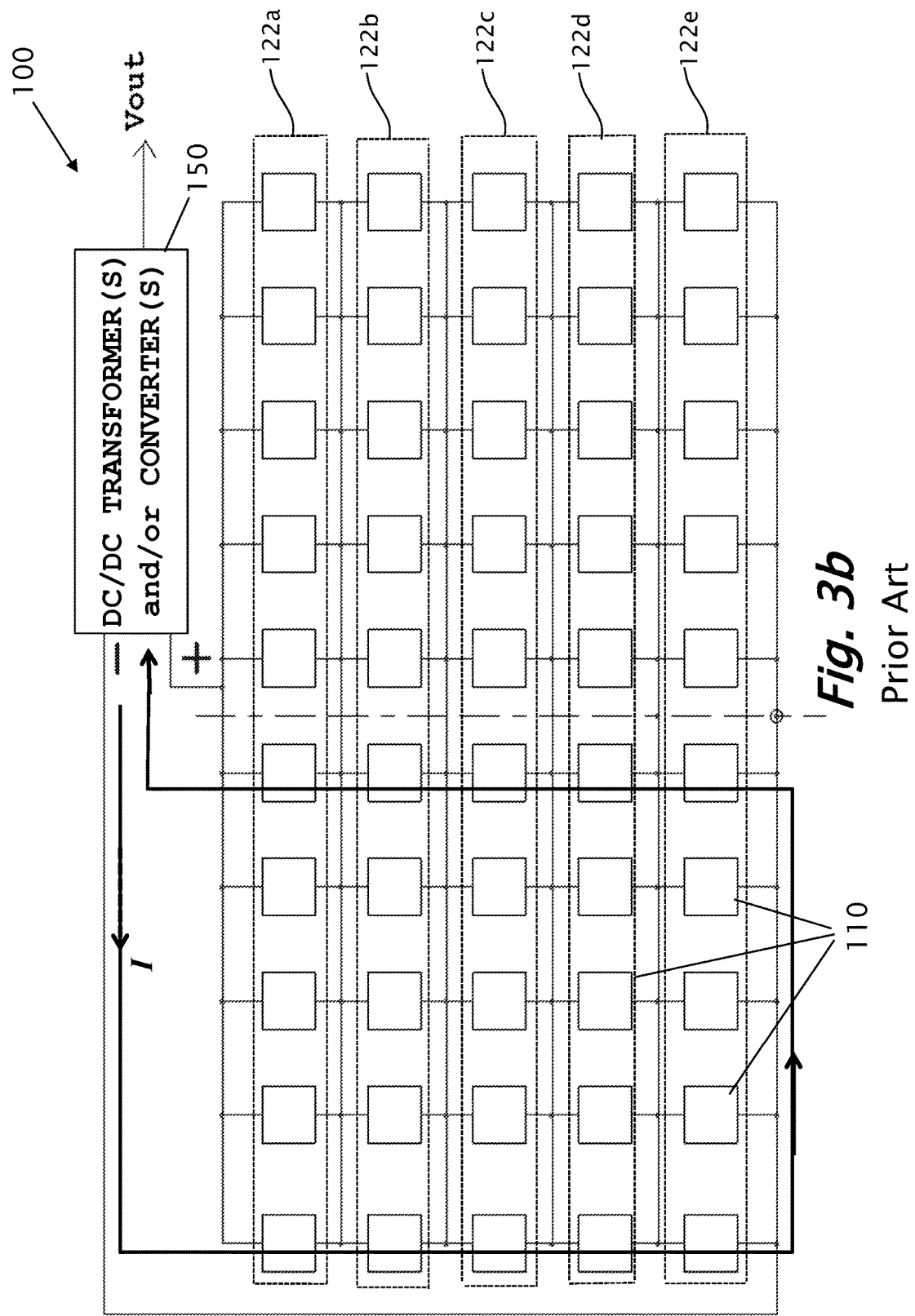
FIG. 3b (prior art) is a schematic block diagram showing a variation of the solar-array module shown in FIG. 2.
Figure 3C:
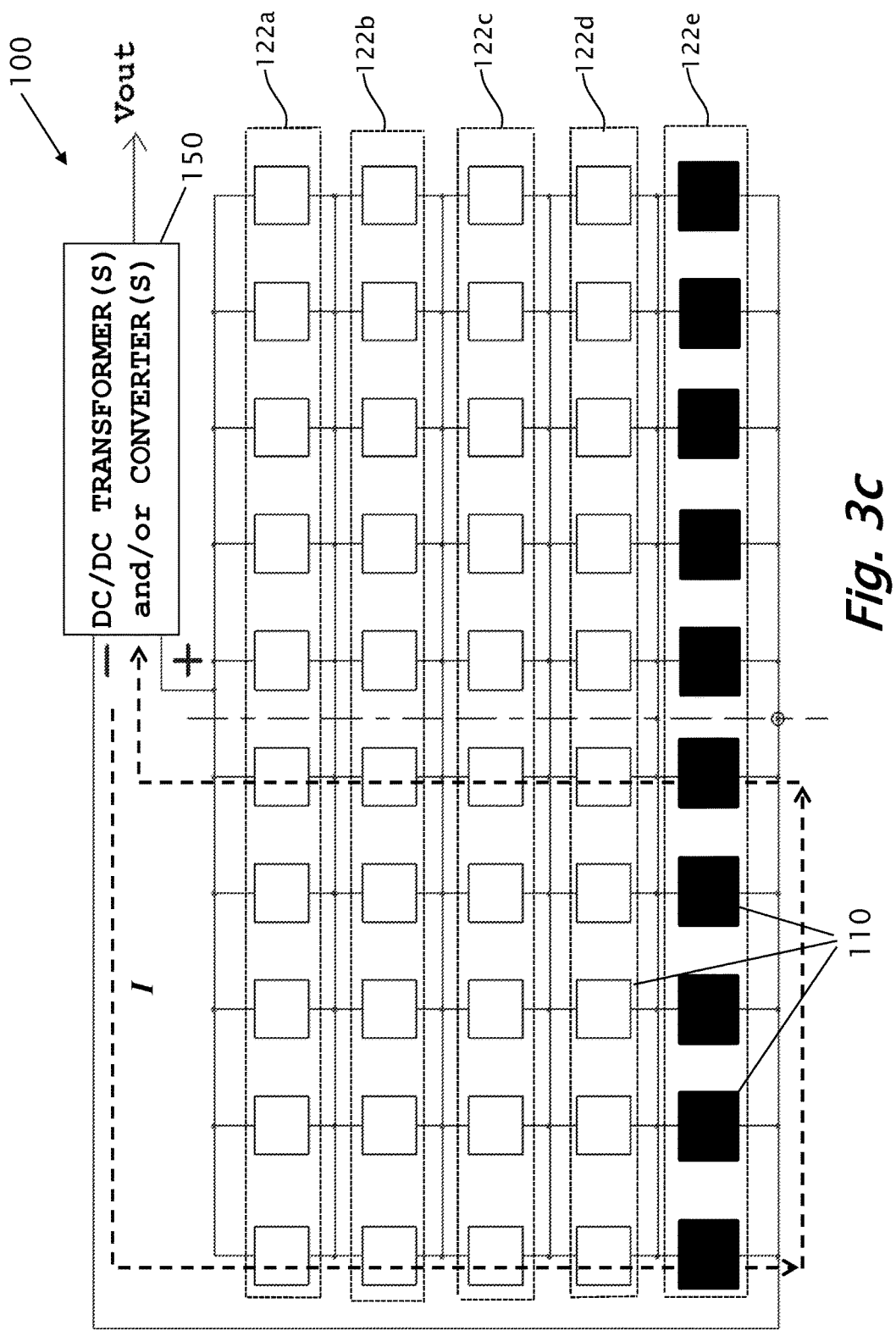
FIG. 3c (prior art) shows the schematic block diagram shown in FIG. 3b, wherein the solar cells in the lower row of cells are obstructed such that reduced or no light reaches them, thereby substantially reducing the power generation of solar array module system.
Figure 17:
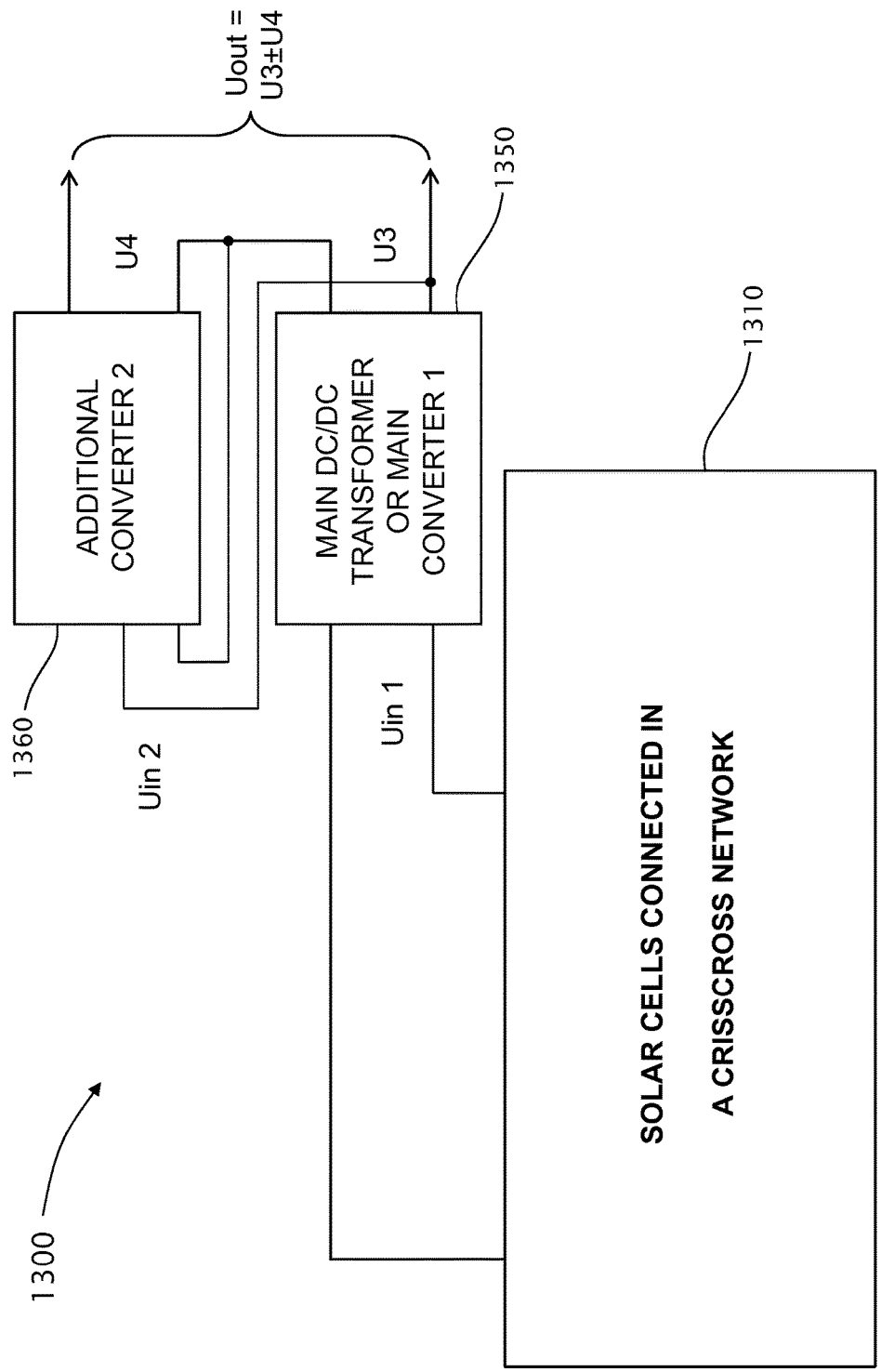
FIG. 17 is a schematic illustration showing a first example of a solar-array module, including an array of crisscross network of solar cells and a main DC/DC transformer or DC/DC transformers (not shown), or main converter or main converters (not shown), connected at the exit of the array of solar cells, and additional converter or converters (not shown) wherein the input is fed from the output of the main DC/DC transformer or converter. The output of the additional converter is connected in series with the output of the main DC/DC transformer/s or to converter/s.
Figure 18:
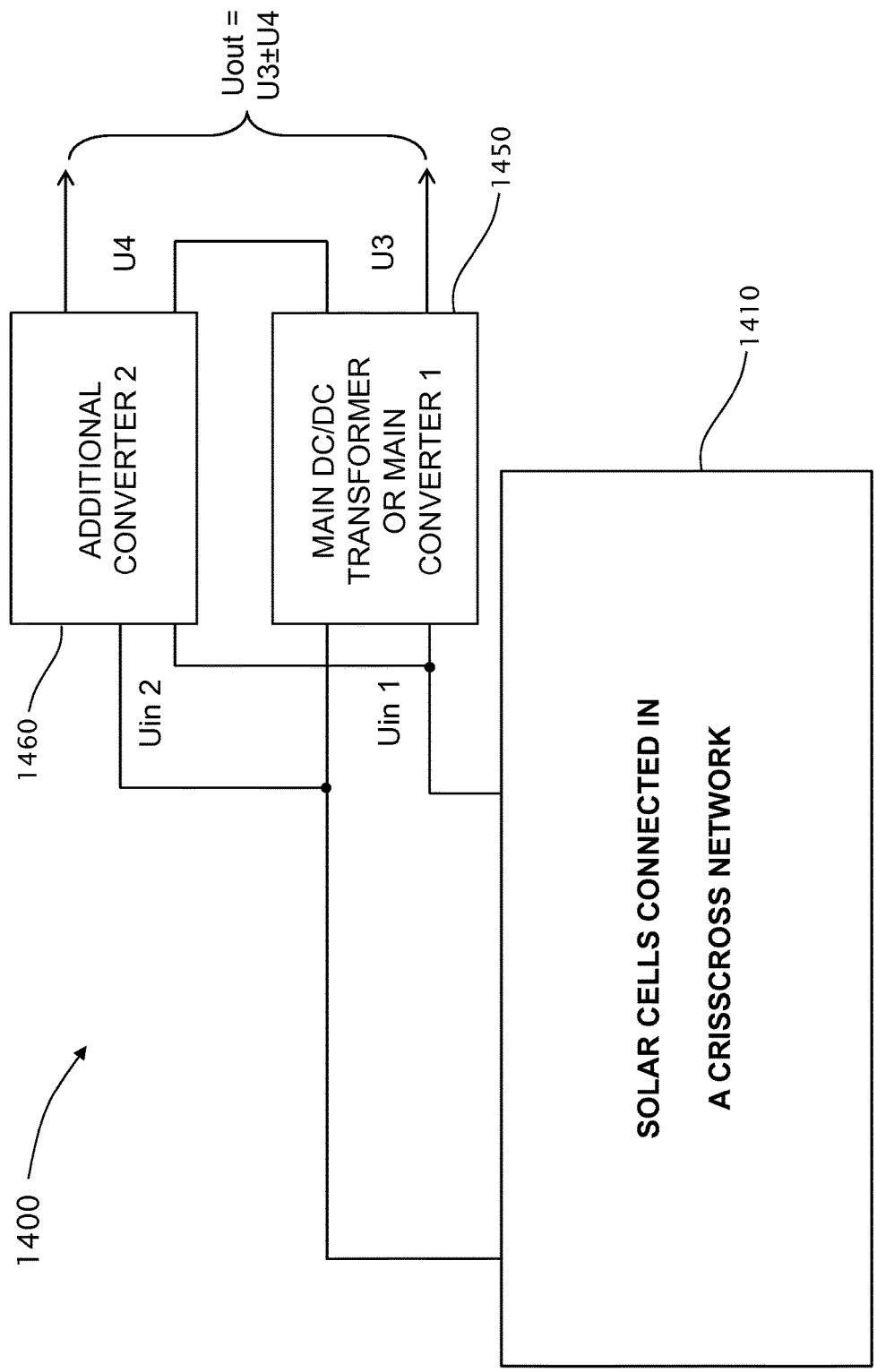
FIG. 18 is a schematic illustration showing a second example of a solar-array module, including an array of crisscross network of solar cells and a main DC/DC transformer or DC/DC transformers (not shown), or main converter or main converters (not shown), and an additional converter or converters (not shown) wherein the input connected at the exit of the array of solar cells and the output connected in series with output of the main DC/DC transformer/s or converter/s.

An aspect of the present invention is to provide a system and method that enables each solar-array module to operate at its most efficient MPP. Reference is made to FIGS. 17 and 18, schematically illustrating exemplary solar-array modules 1300 and 1400, respectively, including an array (1310 and 1410, respectively) of crisscross network of solar cells. As previously described, each solar array module (1300 and 1400) may optionally be characterized according to the art known crisscross electrical configuration of FIG. 3, the additional and/or alternative electrical interconnections 234 of FIG. 4, the rotated physical configuration of FIG. 6 (or any related configurations shown herein) or a combination thereof.

Solar-array module 1300 includes also and a pair of DC/DC transformer/converters (1350 and 1360, and 1450 and 1460, respectively), connected at the exit of the array of solar cells, according to variations of the present invention, wherein the converters (1350 and 1360, and 1450 and 1460, respectively) convert the input voltage level to a significantly higher output voltage level while maintaining the output power substantially at the MPP of the array of solar cells (1310 and 1410, respectively). Arrays 1310 and 1410 may optionally each individually be characterized according to the art known crisscross electrical configuration of FIG. 3, the additional and/or alternative crisscross electrical configuration with rotated cells physical positions of FIG. 4, 6, 8 or 10 (or any related configurations shown herein) or a combination thereof. For the avoidance of doubt, arrays 1310 and 1410 may not be identical.

Solar-array module 1300 includes a very high efficiency DC/DC transformer or converter 1350 that converts the input voltage level to a significantly higher output voltage level. There may be a plurality of DC/DC transformers or converters (not shown). The voltage conversion is performed efficiently and at a low cost from a high current and low voltage level at the input point. There is no regulation of the output voltage (according to FIG. 13) and therefore it is not possible to track the MPP. To facilitate detection of the solar-array module output MPP, it is required to alter the output voltage of the solar-array module in order to obtain a preconfigured voltage level across the solar cells and hence to achieve the MPP. For example, due to a change in lighting conditions (that is, reduced access to light) from 1000 watts per square meter to 800 watts per square meter, the current produced by the panel would also drop, which would require an reducing in voltage back to the MPP of the panel (for example, 28 volts). In such a situation, using a converter with a voltage-regulator rather than a DC/DC transformer may substantially reduce the efficiency and increase cost.

Adding another converter 1360, with variable output voltage, which therefore combines with the constant output voltage of main DC/DC transformer/converter 1350 to support the desired output voltage despite the partially variable output voltage produced by solar-array modules 1300, facilitates enabling solar-array modules 1300 to work substantially at the MPP. To minimize the deficiency in efficiency, the main DC/DC transformer/converter 1350 is preconfigured to provide the majority of the output power of solar-array modules 1300, and the second converter 1360 is preconfigured to provide a smaller portion of the output power of solar-array modules 1300.

Example:

The output power of the solar-array module 1410 is 300 Watt;

The output voltage of main DC/DC transformer/converter 1450 is 30 Volt (U4);

The output voltage of second converter 1460 is 3 Volt (U3)

The efficiency of main DC/DC transformer/converter 1450 is rated as 96%;

The efficiency of second converter 1460 is rated as only 85%.

Hence, the output voltage of solar-array module 1300 is U4+U3, that is: 33V.

The total output power is computed as follow:

$$\frac{(300\ W * 30\ V) * 0.96}{33\ V} + \frac{(300\ W * 3\ V) * 0.85}{33\ V} = 285\ W;$$

The efficiency of solar-array module 1400 is computed as follow:

$$\frac{285\ W * 100}{300\ W} = 95\%.$$

Hence, the total efficiency is reduced by 1% only.

In the described example, the voltage regulation is facilitated in the range of 0-10%. Referring back to FIG. 15, which illustrates the influence of temperature fluctuation between 25° C. and 75° C., the knees of the 3 graphs are situated between 24V and 28V. At a temperature of 50° C., the knee is situated around 26V. In the irradiation chart, the 5 graphs are situated between 26V and 29V. Hence, the irradiation regulation range is ±5%. Hence, the overall regulation range is ±10%, in this example, which covers the whole range of irradiance and temperature change.

It should be noted that second converter 1360 or 1460, respectively, may be fed from the output voltage of main DC/DC transformer/converter 1350, as shown in FIG. 17, or directly from the output voltage of solar-array module 1410, as shown in FIG. 18.

It should be further noted that the voltage regulation is not limited to a range of 0-10% and the range may be 0-100%.

It should be further noted that the regulation can be embodied with two (2) additional converters or indeed any suitable number of converters.

It should be further noted that the regulation at the system level can still be performed by a DC/AC inverter (see FIG. 16).

Figure 19:
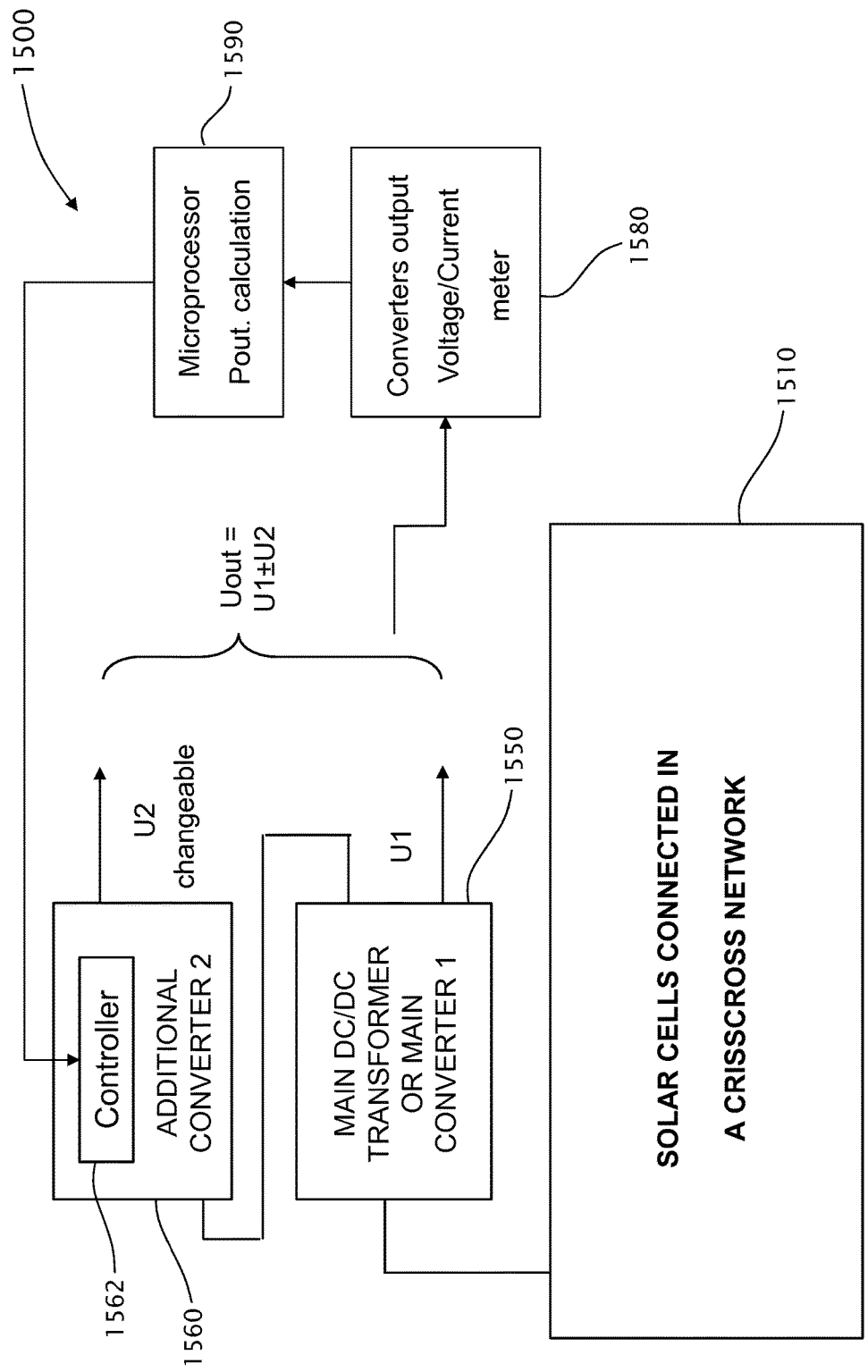
FIG. 19 is a schematic illustration showing an example of a solar-array module, including an array of crisscross network of solar cells and a main DC/DC transformer/s or a main converter/s, and an additional converter/s, converters output voltage/current meter, microprocessor, change the module output voltage by means of a controller of the additional converter voltage reference in order to obtain the solar-array module MPP.

Referring to FIG. 19, a schematic illustration showing an example of a solar-array module 1500 is shown. Solar-array module 1500 includes an array of crisscross network of solar cells 1510. As previously described, each solar array module 1500 may optionally be characterized according to the art known crisscross electrical configuration of FIG. 3, the additional and/or alternative electrical interconnections 234 of FIG. 4, the rotated physical configuration of FIG. 6 (or any related configurations shown herein) or a combination thereof.

Solar-array module 1500 includes also a main DC/DC transformer or a main converter 1550, and an additional converter 1560 that converters output voltage/current meter 1580. Microprocessor 1590 changes the output voltage of solar array module 1510 by means of controller 1562 of an additional converter 1560 voltage reference, in order to obtain the module MPP. As previously described, each solar array module 1500 may optionally be characterized according to the art known crisscross electrical configuration of FIG. 3, the additional and/or alternative electrical interconnections 234 of FIG. 4, the rotated physical configuration of FIG. 6 (or any related configurations shown herein) or a combination thereof.

Each solar array module 1500 includes a circuitry 1580 for measuring the output current and voltage of solar array module 1500. The resulting measurements are obtained by microprocessor 1590 that continuously computes the module's power. Microprocessor 1590 is operatively coupled with controller 1562 of an additional converter 1560 and can thereby change the reference voltage of controller 1562 and thereby also change the output voltage of additional converter 1560 and of solar array module 1500, in order to obtain the MPP of solar array module 1500.

Figure 20:
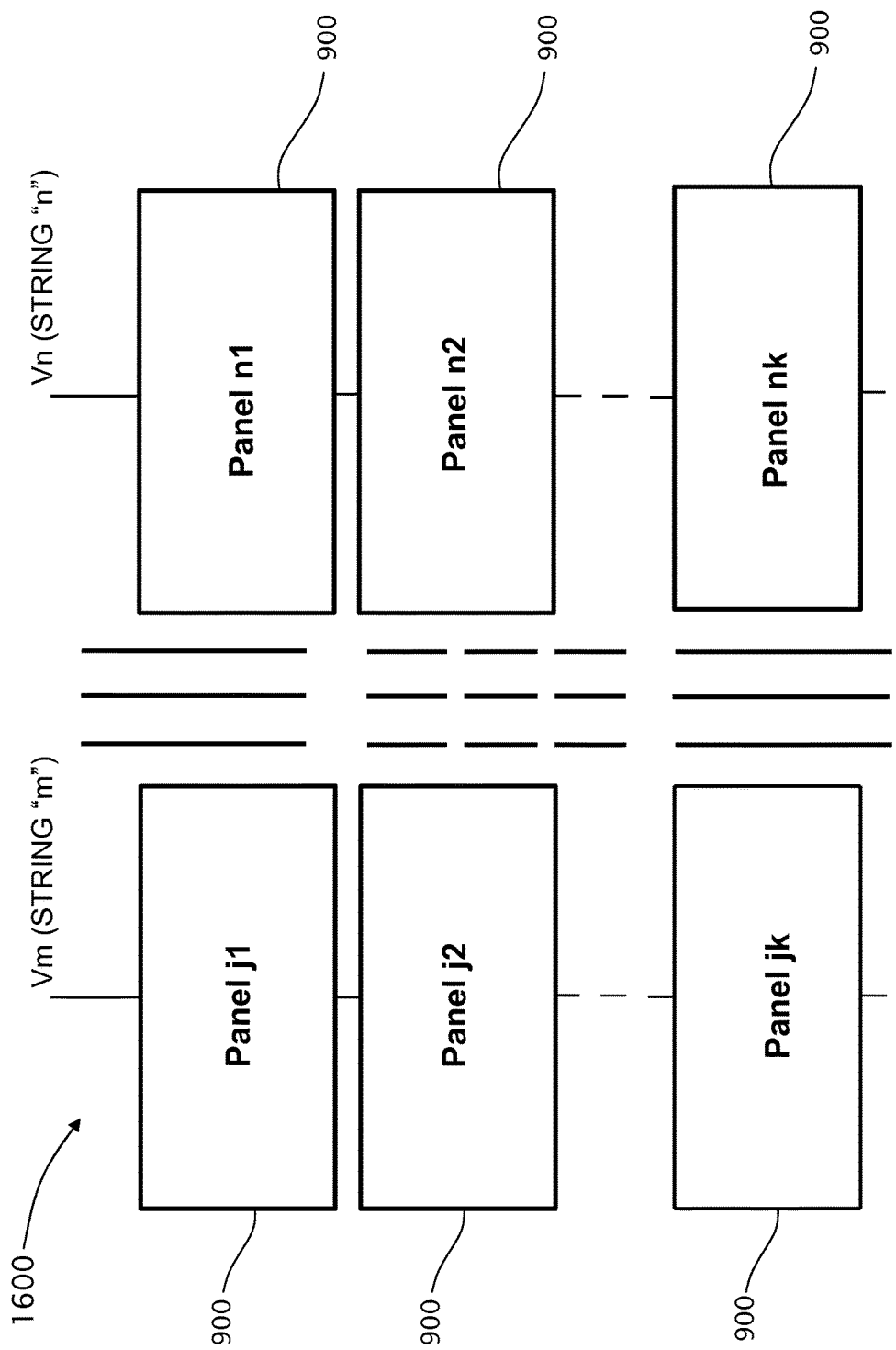
FIG. 20 (prior art) is a schematic illustration showing an example solar-array system, having several strings of solar-array modules. Each string has different voltage (Vm . . . Vn).

FIG. 20 (prior art) is a schematic illustration showing an example solar-array system 1600, having several strings of solar array modules 900. Typically, each string of solar array modules 900 has a different output voltage (Vm . . . Vn) according to the accumulated voltages of the individual solar array module 900. Parallel electric connection of strings of solar array modules 900 brings about loss of system power.

Figure 21:
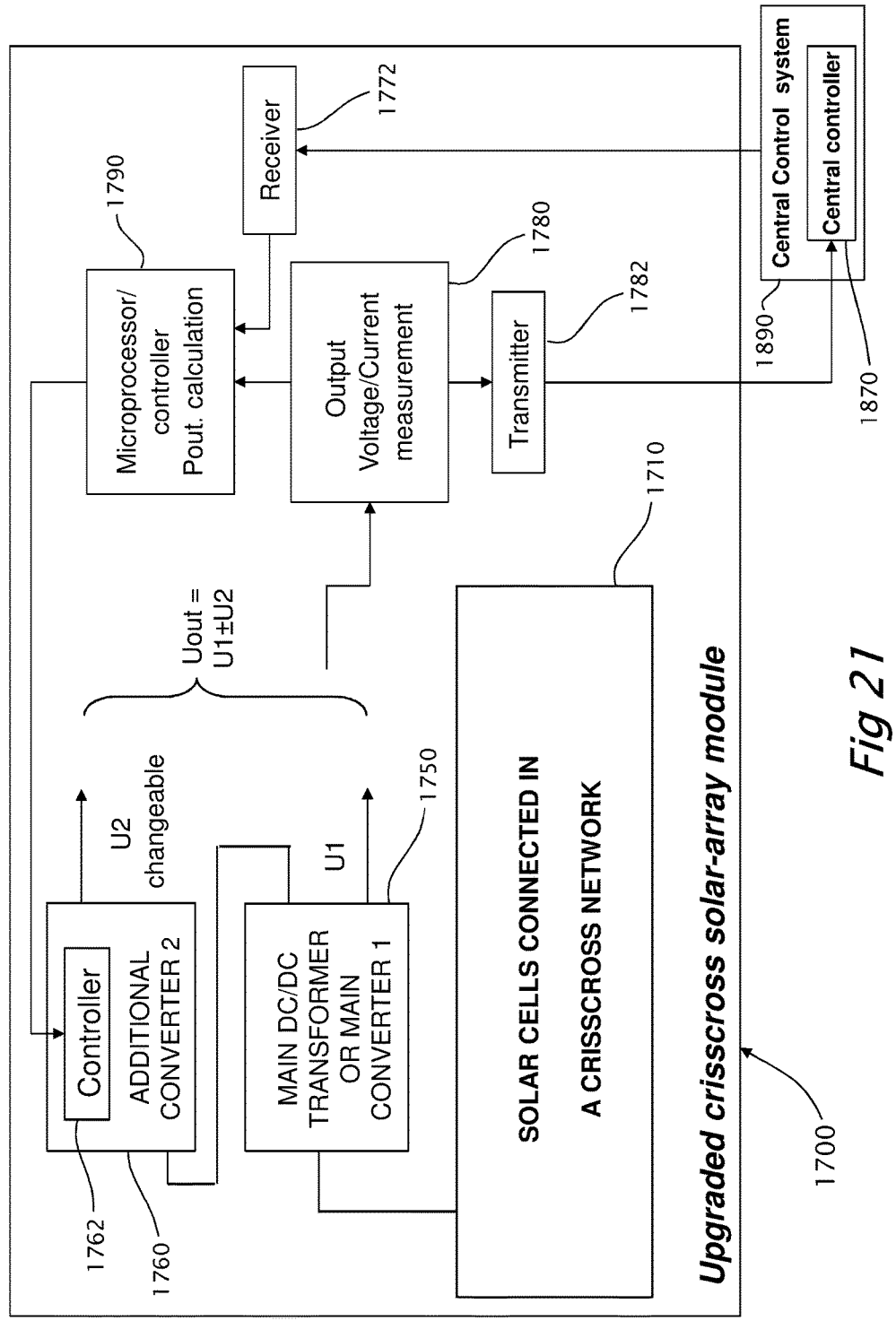
FIG. 21 is a schematic illustration showing an example of a solar-array module, including an array of crisscross network of solar cells and a main DC/DC transformer/s or a main converter/s, and an additional converter/s, converters output voltage/current meter, microprocessor, transmitter and receiver, for transferring measurement data from a solar-array module to the general system central controller (CC) and for transferring CC commands to each solar-array module for output voltage regulation.

FIG. 21 is a schematic illustration showing an example of a solar-array module 1700 including an array of crisscross network of solar cells 1710, which may optionally be characterized as previously described, a main DC/DC transformer or a main converter 1750, an additional converter 1760, an output voltage/current meter 1780 and a microprocessor 1790. This is similar to respective elements of solar-array module 1500. However, solar-array module 1700 includes elements that facilitate communication with a general solar central control system 1890 that may intervene in the control of each individual solar-array module 1700 and will change the output voltage of a solar-array module 1700. Each individual solar-array module 1700 further includes a transmitter 1782 for transferring measurement data from output voltage/current meter 1780 to a central controller 1870 of central control system 1890, and a receiver 1772 for receiving control commands from central controller 1870.

Figure 22:
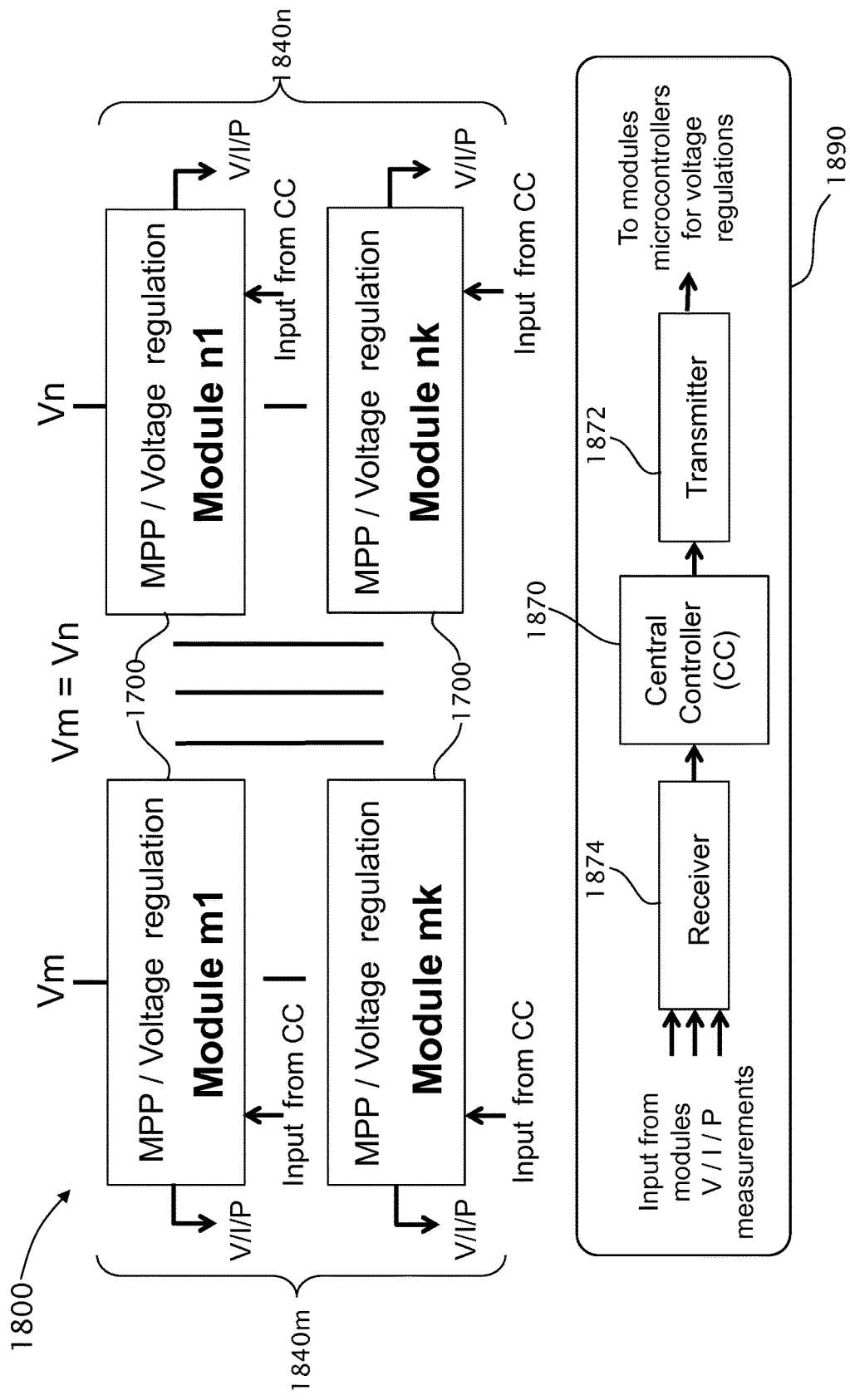
FIG. 22 is a schematic illustration showing an example solar-array system, having several strings of solar-array modules. Each solar-array module (having an array of solar cells connected in crisscross network) has an MPP/voltage regulation inner system. Each string has the same voltage (Vm=Vn). Central controller (CC) receives a measurement data regarding each solar-array module voltage, current and output power via a receiver, and the CC transfers the commands to each solar-array module for output voltage regulation via a transmitter.

Reference is also made to FIG. 22, a schematic illustration showing an example solar-array system 1800, having several strings 1840 of solar-array modules 1700 (each having an array of solar cells connected in crisscross network, which may optionally be characterized as previously described). Each solar-array module 1700 has MPP/voltage regulation inner control sub-system. A central control system 1890 having a CC 1870 received measurement data regarding voltage of each string 1840 of solar-array modules 1700, as well as voltage, current and output power of each solar-array module 1700. After receiving the data from solar-array modules 1700, through receiver 1874 and performing the required calculations to thereby derive regulation commands, CC 1870 sends the regulation commands through, transmitter 1872, to each solar-array module 1700 for a desired output voltage. As result of this voltage regulation, each string of solar-array modules 1700 has the same output voltage (Vm=Vn).

It should be note that central control system 1890 may communicate with each solar-array module 1700 through either wirelessly or wired communication means.

It should be further noted that the regulation at the system level can still be performed by a DC/AC inverter (not shown) or by any of the aforementioned embodiments.

Figure 23:
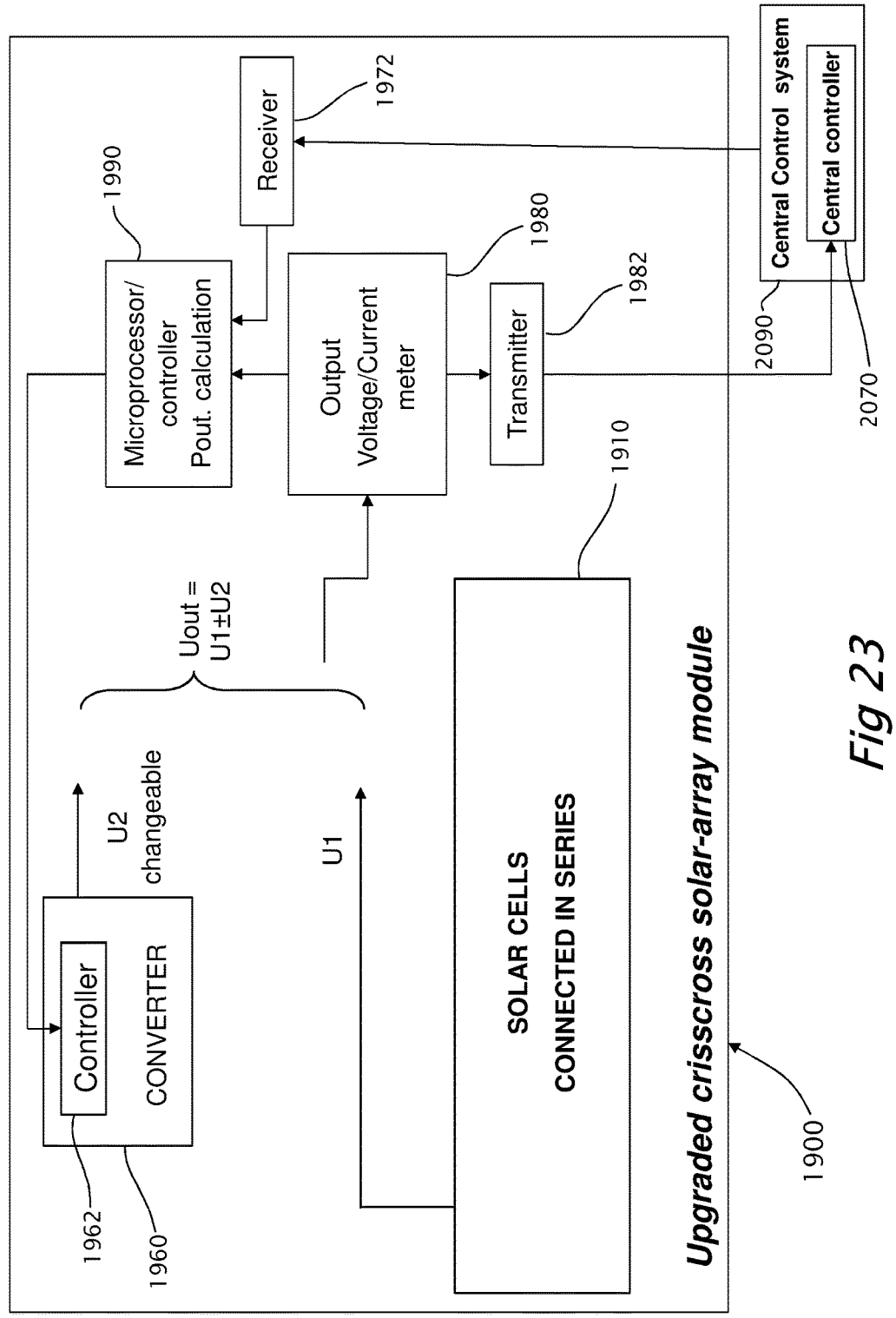
FIG. 23 is a schematic illustration showing an example of an upgraded solar-array regular module, including an array of solar cells connected in series and converter, when it's input connected at the exit of the array of solar cells and its output connected in series with output of module output such that the module output voltage is a sum of array of solar cell voltages and converter voltages. In addition showing, converter and solar-array module output voltage/current meter, microprocessor, transmitter and receiver, for transferring measurement data from the solar-array module to the general solar-array module system central controller (CC) and for transferring CC commands to each solar-array module for output voltage regulation.

FIG. 23 is a schematic illustration showing an example of a solar-array module 1900 including an array of solar cells 1910 connected in series, an additional converter 1960, an output voltage/current meter 1980 and a microprocessor 1990. Solar-array module 1900 includes elements that facilitate communication with a general central solar control system 2090 that may intervene in the control of each individual solar-array module 1900 and will change the output voltage of a solar-array module 1900. Each individual solar-array module 1900 further includes a transmitter 1982 for transferring measurement data from output voltage/current meter 1980 to a central controller 2070 of central control system 2090, and a receiver 1972 for receiving control commands from central controller 2070.

Figure 24:
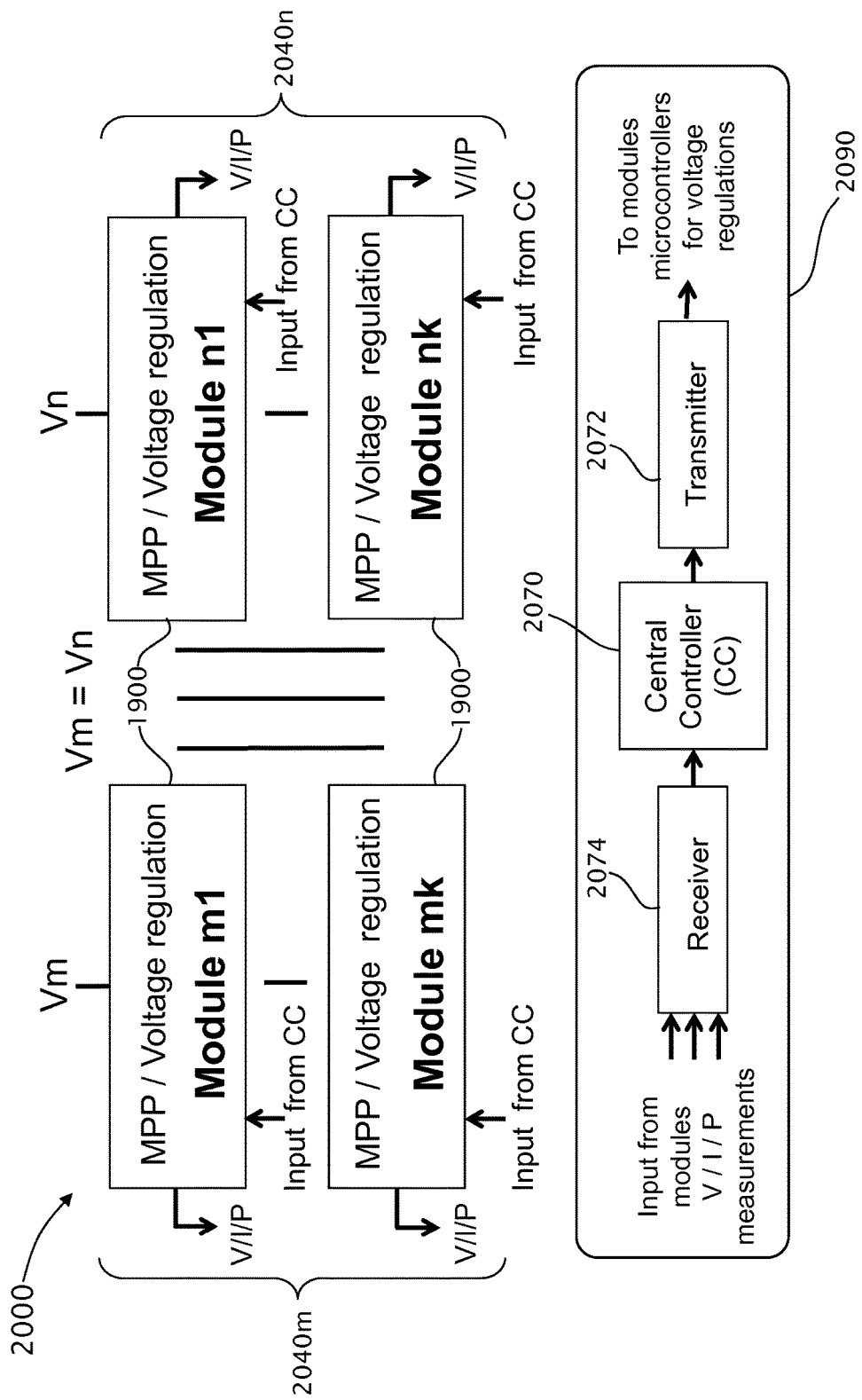
FIG. 24 is a schematic illustration showing an example regular solar-array module (including an array of solar cells connected in series) system, having several strings of solar-array modules. Each solar-array module has MPP/Voltage regulation inner system. Each string has the same voltage (Vm=Vn). Central system controller (CC) received a measurement data regarding each solar-array module voltage, current and output power means receiver, and CC transfer the commands to each solar-array module for output voltage regulation means transmitter.

Reference is also made to FIG. 24, a schematic illustration showing an example solar-array system 2000, having several strings 2040 of solar-array modules 1900 (each having an array of solar cells connected in series, not shown). Each solar-array module 1900 has MPP/Voltage regulation inner control sub-system. A central control system 2090 having a CC 2070 received measurement data regarding voltage of each string 2040 of solar-array modules 1900, as well as voltage, current and output power of each solar-array module 1900. After receiving the data from solar-array modules 1900, through receiver 2074 and performing the required calculations to thereby derive regulation commands, CC 2070 sends the regulation commands through, transmitter 2072, to each solar-array module 1900 for a desired output voltage. As result of this voltage regulation, each string of solar-array modules 1900 has the same output voltage (Vm=Vn).

It should be note that central control system 2090 may communicate with each solar-array module 1900 through either wirelessly or wired communication means.

It should be further noted that the regulation at the system level can still be performed by a DC/AC inverter (not shown) or by any of the aforementioned embodiments.

The present invention being thus described in terms of several embodiments and examples, it will be appreciated that the same may be varied in many ways. Such variations are not to be regarded as a departure from the spirit and scope of the invention, and all such modifications as would be obvious to one skilled in the art are contemplated.

What is claimed is:

1. A solar power generation system for minimizing the power degradation inflicted by light obstructions, the system comprising at least one solar-array module, wherein said at least one solar array module comprises:
   a) a multiplicity of solar cells, physically arranged in a N×M matrix configuration,
      wherein a preconfigured number (M) of said solar cells are electrically connected in series to form a string of serial-units, said string of serial-units is facilitated to produce a first output voltage level;
      wherein a preconfigured number (N) of said strings of serial-units are electrically connected in parallel to form an array of said solar cells, said array of said solar cells is facilitated to produce a first output power level;
      wherein in each of said strings of serial-units, at least one selected solar cell of one of said strings of serial-units is also electrically connected in parallel to a respective solar cell of all other strings of serial-units, to form a plain, electrically interconnected electrical crisscross N×M matrix array of solar cells;
      wherein at least two of the solar cells in said electrically interconnected electrical crisscross N×M matrix array of solar cells do not overlap with the respective solar cells in said physical N×M matrix configuration of solar cells;
      wherein when N=M*2, said N×M physical matrix configuration of solar cells is rearranged by subdividing said physical matrix into two N/2×M matrices: a first matrix section (340) and a second matrix section (342), wherein said solar cells are arranged in vertical strings,
      wherein the solar cells of said first matrix section are disposed such that said solar cells of said first matrix section form a matrix that is rotated 90° counterclockwise with respect to said plain electrical crisscross matrix array, and thereby, physically, said vertical strings become horizontal strings;
      wherein the solar cells of said second matrix section are disposed such that said solar cells of said second matrix section form a matrix that is rotated 90° clockwise with respect to said plain electrical crisscross matrix array, and thereby, physically, said vertical strings become horizontal strings; and
   b) at least one high efficiency DC/DC converter electrically connected to said crisscross matrix array of solar cells, said DC/DC converter configured to boost said first output voltage level to a second output voltage level higher than said first output voltage level wherein said solar cells are interconnected such that the "+" polarity of each of said horizontal strings of solar cells is electrically connected to the "+" input of said DC/DC converter and the "−" polarity of each of said horizontal strings of solar cells is connected to the "−" input of said DC/DC converter.

2. The solar power generation system of claim 1, wherein said at least one DC/DC converter is selected from the group consisting essentially of at least one DC/DC converter, at least one DC/DC power converter, at least one DC/DC transformer, at least one power converter integrated with at least one DC/DC transformer, or a combination thereof.

3. The modular solar system as in claim 1, wherein said at least one solar array module further comprises at least two high efficiency DC/DC converters, with outputs interconnected in parallel, and electrically connected to said crisscross matrix array of solar cells or to any other type crisscross matrix array of solar cells, wherein each of said at least two high efficiency DC/DC converters is configured to provide a significantly higher system output voltage.

4. The solar power generation system of claim 1, wherein said at least one solar array module further comprises k high efficiency DC/DC converters, with outputs interconnected in parallel, and electrically connected to said crisscross matrix array of solar cells or to any other type crisscross matrix array of solar cells, wherein the duty cycle of each of said k high efficiency DC/DC converters is T/k, T being the switching cycle of each of said k high efficiency DC/DC converters, such that the current pulses produced by each of said k high efficiency DC/DC converters are timely cascaded within each cycle, and integrate to produce a substantially DC input current.

5. The solar power generation system of claim 4, wherein said current pulses have overlap, wherein said overlap is zero or higher.

6. The solar power generation system of claim 1, wherein said at least one solar array module, being a regulated solar array module (1500), further comprises an additional DC/DC converter (1360, 1460, 1560), having a controllable output voltage and/or output current; a module regulation sub-system, said module regulation sub-system comprising a module processor (1590); and a voltage and/or current monitor (1580) for monitoring the output power level of said regulated solar array module,
    wherein said additional DC/DC converter includes a controller (1562);
    wherein said module processor is in communication flow with said voltage and/or current monitor to thereby obtain the maximum power point (MPP) of the output power level of said regulated solar array module;
    wherein said module processor is in communication flow with said controller to thereby control said controllable output voltage, based on said MPP of said output power level; and
    wherein said additional DC/DC converter combines with said at least one high efficiency DC/DC converter, to provide said control of said controllable output voltage to provide a maximum power output of said regulated solar array module in different light, temperature and other conditions and to maximize solar modules power generation.

7. The solar power generation system of claim 6, being a regulated solar power generation system (1800), further comprises a central control system (1890), having a central controller (1870),
    wherein said regulated solar power generation system comprises multiple solar array modules arranged in at least one string of regulated solar array modules;
    wherein said central controller operatively controls said module processor to control the maximum power output of the respective solar string of modules; and
    wherein said central controller of said central control system monitors and controls the output voltage of each of said at least one string of regulated solar array modules, to thereby provide a maximum power output of said at least one string of regulated solar array modules in different light, temperature and other conditions.

8. The solar power generation system of claim 7, wherein a preconfigured number of said regulated solar array modules are electrically connected in series to form a string of solar-array modules, wherein said array of solar-array modules produces a third output voltage level.

9. The solar power generation system of claim 8, wherein said third output voltage level is sufficient to meet an application operating voltage level requirement.

10. The solar power generation system of claim 8, wherein a preconfigured number of said strings of solar-array modules are electrically connected in parallel, to form an array of solar-array modules, wherein said array of solar-array modules produces a fourth output power level.

11. The solar power generation system of claim 10, wherein said fourth output power level is sufficient to meet an application operating power level requirement.

12. The solar power generation system of claim 7, wherein said DC/DC converter comprises MOSFET transistors or other suitable type of transistors.

13. A solar power generation system for minimizing the power degradation inflicted by light obstructions, the system comprising at least one solar-array module, wherein said at least one solar array module comprises:
  a) a multiplicity of solar cells, physically arranged in a N×M matrix configuration,
    wherein a preconfigured number (M) of said solar cells are electrically connected in series to form a string of serial-units, said string of serial-units is facilitated to produce a first output voltage level;
    wherein a preconfigured number (N) of said strings of serial-units are electrically connected in parallel to form an array of said solar cells, said array of said solar cells is facilitated to produce a first output power level;
    wherein in each of said strings of serial-units, at least one selected solar cell of one of said strings of serial-units is also electrically connected in parallel to a respective solar cell of all other strings of serial-units, to form a plain, electrically interconnected electrical crisscross N×M matrix array of solar cells;
    wherein at least two of the solar cells in said electrically interconnected electrical crisscross N×M matrix array of solar cells do not overlap with the respective solar cells in said physical N×M matrix configuration of solar cells;
    wherein when N=M*2, said N×M physical matrix configuration of solar cells is rearranged by subdividing said physical matrix into two N/2×M matrices: a first matrix section (340) and a second matrix section (342), wherein said solar cells are arranged in vertical strings,
    wherein the solar cells of said first matrix section are disposed such that said solar cells of said first matrix section form a matrix that is rotated 90° clockwise with respect to said plain electrical crisscross matrix array, and thereby, physically, said vertical strings become horizontal strings;
    wherein the solar cells of said second matrix section are disposed such that said solar cells of said second matrix section form a matrix that is rotated 90° counterclockwise with respect to said plain electrical crisscross matrix array, and thereby, physically, said vertical strings become horizontal strings; and
  b) at least one high efficiency DC/DC converter electrically connected to said crisscross matrix array of solar cells, said DC/DC converter configured to boost said first output voltage level to a second output voltage level higher than said first output voltage level; wherein said solar cells are interconnected such that the "+" polarity of each of said horizontal strings of solar cells is electrically connected to the "+" input of said DC/DC converter and the "−" polarity of each of said horizontal strings of solar cells is connected to the "−" input of said DC/DC converter.

14. The solar power generation system as in claim 13, wherein said at least one solar array module further comprises at least two high efficiency DC/DC converters, with outputs interconnected in parallel, and electrically connected to said crisscross matrix array of solar cells or to any other type crisscross matrix array of solar cells, wherein each of said at least two high efficiency DC/DC converters is configured to provide a higher system output voltage.

15. The solar power generation system of claim 13, wherein said at least one solar array module further comprises k high efficiency DC/DC converters, with outputs interconnected in parallel, and electrically connected to said crisscross matrix array of solar cells or to any other type crisscross matrix array of solar cells, wherein the duty cycle of each of said k high efficiency DC/DC converters is T/k, T being the switching cycle of each of said k high efficiency DC/DC converters, such that the current pulses produced by each of said k high efficiency DC/DC converters are timely cascaded within each cycle, and integrate to produce a substantially DC input current.

16. The solar power generation system of claim 15, wherein said current pulses have overlap, wherein said overlap is zero or higher.

17. The solar power generation system of claim 13, wherein said at least one solar array module, being a regulated solar array module (1500), further comprises an additional DC/DC converter (1360, 1460, 1560), having a controllable output voltage and/or output current; a module regulation sub-system, said module regulation sub-system comprising a module processor (1590); and a voltage and/or current monitor (1580) for monitoring the output power level of said regulated solar array module,
wherein said additional DC/DC converter includes a controller (1562);
wherein said module processor is in communication flow with said voltage and/or current monitor to thereby obtain the maximum power point (MPP) of the output power level of said regulated solar array module;
wherein said module processor is in communication flow with said controller to thereby control said controllable output voltage, based on said MPP of said output power level; and
wherein said additional DC/DC converter combines with said at least one high efficiency DC/DC converter, to provide said control of said controllable output voltage to provide a maximum power output of said regulated solar array module in different light, temperature and other conditions and to maximize solar modules power generation.

18. The solar power generation system of claim 17, being a regulated solar power generation system (1800), further comprises a central control system (1890), having a central controller (1870),
wherein said regulated solar power generation system comprises multiple solar array modules arranged in at least one string of regulated solar array modules;
wherein said central controller operatively controls said module processor to control the maximum power output of the respective solar string of modules; and
wherein said central controller of said central control system monitors and controls the output voltage of each of said at least one string of regulated solar array modules, to thereby provide a maximum power output of said at least one string of regulated solar array modules in different light, temperature and other conditions.

19. The solar power generation system of claim 18, wherein a preconfigured number of said regulated solar array modules are electrically connected in series to form a string of solar-array modules, wherein said array of solar-array modules produces a third output voltage level.

20. The solar power generation system of claim 19, wherein said third output voltage level is sufficient to meet an application operating voltage level requirement.

21. The solar power generation system of claim 19, wherein a preconfigured number of said strings of solar-array modules are electrically connected in parallel, to form an array of solar-array modules, wherein said array of solar-array modules produces a fourth output power level.

22. The solar power generation system of claim 21, wherein said fourth output power level is sufficient to meet an application operating power level requirement.

23. The solar power generation system of claim 13, wherein said DC/DC converter comprises MOSFET transistors or other suitable type of transistors.

24. A solar power generation system for minimizing the power degradation inflicted by light obstructions, the system comprising at least one solar-array module, wherein said at least one solar array module comprises:
 a) a multiplicity of solar cells, physically arranged in a N×M matrix configuration,
  wherein a preconfigured number (M) of said solar cells are electrically connected in series to form a string of serial-units, said string of serial-units is facilitated to produce a first output voltage level;
  wherein a preconfigured number (N) of said strings of serial-units are electrically connected in parallel to form an array of said solar cells, said array of said solar cells is facilitated to produce a first output power level;
  wherein in each of said strings of serial-units, at least one selected solar cell of one of said strings of serial-units is also electrically connected in parallel to a respective solar cell of all other strings of serial-units, to form a plain, electrically interconnected electrical crisscross N×M matrix array of solar cells;
  wherein at least two of the solar cells in said electrically interconnected electrical crisscross N×M matrix array of solar cells do not overlap with the respective solar cells in said physical N×M matrix configuration of solar cells;
  wherein said N×M physical matrix configuration of solar cells is rearranged by subdividing said physical matrix into two generally equal matrices: a first matrix section (602) and a second matrix section (604), wherein said solar cells are arranged in vertical strings,
  wherein the solar cells of said first matrix section are individually rotated 90° clockwise and wherein each row of said rotated solar cells are electrically interconnected into horizontal strings;
  wherein the solar cells of said second matrix section are individually rotated 90° counterclockwise and wherein each row of said rotated solar cells are electrically interconnected into horizontal strings; and
 b) at least one high efficiency DC/DC converter electrically connected to said crisscross matrix array of solar cells, said DC/DC converter configured to boost said first output voltage level to a second output voltage level higher than said first output voltage level; wherein said solar cells are interconnected such that the "+" polarity of each of said horizontal strings of solar cells is electrically connected to the "+" input of said DC/DC converter and the "−" polarity of each of said horizontal strings of solar cells is connected to the "−" input of said DC/DC converter.

25. The solar power generation system as in claim 24, wherein said at least one solar array module further comprises at least two high efficiency DC/DC converters, with outputs interconnected in parallel, and electrically connected to said crisscross matrix array of solar cells or to any other type crisscross matrix array of solar cells, wherein each of said at least two high efficiency DC/DC converters is configured to provide a higher system output voltage.

26. The solar power generation system of claim 24, wherein said at least one solar array module further comprises k high efficiency DC/DC converters, with outputs interconnected in parallel, and electrically connected to said crisscross matrix array of solar cells or to any other type crisscross matrix array of solar cells, wherein the duty cycle of each of said k high efficiency DC/DC converters is T/k, T being the switching cycle of each of said k high efficiency DC/DC converters, such that the current pulses produced by each of said k high efficiency DC/DC converters are timely cascaded within each cycle, and integrate to produce a substantially DC input current.

27. The solar power generation system of claim 26, wherein said current pulses have overlap, wherein said overlap is zero or higher.

28. The solar power generation system of claim 24, wherein said at least one solar array module, being a regulated solar array module (1500), further comprises an additional DC/DC converter (1360, 1460, 1560), having a controllable output voltage and/or output current; a module regulation sub-system, said module regulation sub-system comprising a module processor (1590); and a voltage and/or current monitor (1580) for monitoring the output power level of said regulated solar array module,
  wherein said additional DC/DC converter includes a controller (1562);
  wherein said module processor is in communication flow with said voltage and/or current monitor to thereby obtain the maximum power point (MPP) of the output power level of said regulated solar array module;
  wherein said module processor is in communication flow with said controller to thereby control said controllable output voltage, based on said MPP of said output power level; and
  wherein said additional DC/DC converter combines with said at least one high efficiency DC/DC converter, to provide said control of said controllable output voltage to provide a maximum power output of said regulated solar array module in different light, temperature and other conditions and to maximize solar modules power generation.

29. The solar power generation system of claim 28, being a regulated solar power generation system (1800), further comprises a central control system (1890), having a central controller (1870),
  wherein said regulated solar power generation system comprises multiple solar array modules arranged in at least one string of regulated solar array modules;
  wherein said central controller operatively controls said module processor to control the maximum power output of the respective solar string of modules; and
  wherein said central controller of said central control system monitors and controls the output voltage of each of said at least one string of regulated solar array modules, to thereby provide a maximum power output of said at least one string of regulated solar array modules in different light, temperature and other conditions.

30. The solar power generation system of claim 29, wherein a preconfigured number of said regulated solar array modules are electrically connected in series to form a string of solar-array modules, wherein said array of solar-array modules produces a third output voltage level.

31. The solar power generation system of claim 30, wherein said third output voltage level is sufficient to meet an application operating voltage level requirement.

32. The solar power generation system of claim 30, wherein a preconfigured number of said strings of solar-array modules are electrically connected in parallel, to form an array of solar-array modules, wherein said array of solar-array modules produces a fourth output power level.

33. The solar power generation system of claim 32, wherein said fourth output power level is sufficient to meet an application operating power level requirement.

34. The solar power generation system of claim 24, wherein said DC/DC converter comprises MOSFET transistors or other suitable type of transistors.

35. A solar power generation system for minimizing the power degradation inflicted by light obstructions, the system comprising at least one solar-array module, wherein said at least one solar array module comprises:
  a) a multiplicity of solar cells, physically arranged in a N×M matrix configuration,
    wherein a preconfigured number (M) of said solar cells are electrically connected in series to form a string of serial-units, said string of serial-units is facilitated to produce a first output voltage level;
    wherein a preconfigured number (N) of said strings of serial-units are electrically connected in parallel to form an array of said solar cells, said array of said solar cells is facilitated to produce a first output power level;
    wherein in each of said strings of serial-units, at least one selected solar cell of one of said strings of serial-units is also electrically connected in parallel to a respective solar cell of all other strings of serial-units, to form a plain, electrically interconnected electrical crisscross N×M matrix array of solar cells;
    wherein at least two of the solar cells in said electrically interconnected electrical crisscross N×M matrix array of solar cells do not overlap with the respective solar cells in said physical N×M matrix configuration of solar cells;
    wherein said N×M physical matrix configuration of solar cells is rearranged by subdividing said physical matrix into two generally equal matrices: a first matrix section (602) and a second matrix section (604), wherein said solar cells are arranged in vertical strings,
    wherein the solar cells of said first matrix section are individually rotated 90° counterclockwise and wherein each row of said rotated solar cells are electrically interconnected into horizontal strings;
    wherein the solar cells of said second matrix section are individually rotated 90° clockwise and wherein each row of said rotated solar cells are electrically interconnected into horizontal strings; and
  b) at least one high efficiency DC/DC converter electrically connected to said crisscross matrix array of solar cells, said DC/DC converter configured to boost said first output voltage level to a second output voltage level higher than said first output voltage level; wherein said solar cells are interconnected such that the "+" polarity of each of said horizontal strings of solar cells is electrically connected to the "+" input of said DC/DC converter and the "−" polarity of each of said horizontal strings of solar cells is connected to the "−" input of said DC/DC converter.

36. The solar power generation system as in claim 35, wherein said at least one solar array module further comprises at least two high efficiency DC/DC converters, with outputs interconnected in parallel, and electrically connected to said crisscross matrix array of solar cells or to any other type crisscross matrix array of solar cells, wherein each of said at least two high efficiency DC/DC converters is configured to provide a higher system output voltage.

37. The solar power generation system of claim 35, wherein said at least one solar array module further comprises k high efficiency DC/DC converters, with outputs interconnected in parallel, and electrically connected to said crisscross matrix array of solar cells or to any other type crisscross matrix array of solar cells, wherein the duty cycle of each of said k high efficiency DC/DC converters is T/k, T being the switching cycle of each of said k high efficiency DC/DC converters, such that the current pulses produced by each of said k high efficiency DC/DC converters are timely cascaded within each cycle, and integrate to produce a substantially DC input current.

38. The solar power generation system of claim 37, wherein said current pulses have overlap, wherein said overlap is zero or higher.

39. The solar power generation system of claim 35, wherein said at least one solar array module, being a regulated solar array module (1500), further comprises an additional DC/DC converter (1360, 1460, 1560), having a controllable output voltage and/or output current; a module regulation sub-system, said module regulation sub-system comprising a module processor (1590); and a voltage and/or current monitor (1580) for monitoring the output power level of said regulated solar array module,
wherein said additional DC/DC converter includes a controller (1562);
wherein said module processor is in communication flow with said voltage and/or current monitor to thereby obtain the maximum power point (MPP) of the output power level of said regulated solar array module;
wherein said module processor is in communication flow with said controller to thereby control said controllable output voltage, based on said MPP of said output power level; and
wherein said additional DC/DC converter combines with said at least one high efficiency DC/DC converter, to provide said control of said controllable output voltage to provide a maximum power output of said regulated solar array module in different light, temperature and other conditions and to maximize solar modules power generation.

40. The solar power generation system of claim 39, being a regulated solar power generation system (1800), further comprises a central control system (1890), having a central controller (1870),
wherein said regulated solar power generation system comprises multiple solar array modules arranged in at least one string of regulated solar array modules;
wherein said central controller operatively controls said module processor to control the maximum power output of the respective solar string of modules; and
wherein said central controller of said central control system monitors and controls the output voltage of each of said at least one string of regulated solar array modules, to thereby provide a maximum power output of said at least one string of regulated solar array modules in different light, temperature and other conditions.

41. The solar power generation system of claim 40, wherein a preconfigured number of said regulated solar array modules are electrically connected in series to form a string of solar-array modules, wherein said array of solar-array modules produces a third output voltage level.

42. The solar power generation system of claim 41, wherein said third output voltage level is sufficient to meet an application operating voltage level requirement.

43. The solar power generation system of claim 41, wherein a preconfigured number of said strings of solar-array modules are electrically connected in parallel, to form an array of solar-array modules, wherein said array of solar-array modules produces a fourth output power level.

44. The solar power generation system of claim 43, wherein said fourth output power level is sufficient to meet an application operating power level requirement.

45. The solar power generation system of claim 35, wherein said DC/DC converter comprises MOSFET transistors or other suitable type of transistors.

46. A solar power generation system for minimizing the power degradation inflicted by light obstructions, the system comprising at least one regulated solar array module (1500), wherein said at least one regulated solar array module comprises:
a) a multiplicity of solar cells, physically arranged in a N×M matrix configuration,
wherein a preconfigured number (M) of said solar cells are electrically connected in series to form a string of serial-units, said string of serial-units is facilitated to produce a first output voltage level;
wherein a preconfigured number (N) of said strings of serial-units are electrically connected in parallel to form an array of said solar cells, said array of said solar cells is facilitated to produce a first output power level;
wherein in each of said strings of serial-units, at least one selected solar cell of one of said strings of serial-units is also electrically connected in parallel to a respective solar cell of all other strings of serial-units, to form a plain, electrically interconnected electrical crisscross N×M matrix array of solar cells;
wherein at least two of the solar cells in said electrically interconnected electrical crisscross N×M matrix array of solar cells do not overlap with the respective solar cells in said physical N×M matrix configuration of solar cells;
b) at least one high efficiency DC/DC converter electrically connected to said crisscross matrix array of solar cells, said DC/DC converter configured to boost said first output voltage level to a second output voltage level higher than said first output voltage level; and
c) an additional DC/DC converter (1360, 1460, 1560), having a controllable output voltage and/or output current; a module regulation sub-system, said module regulation sub-system comprising a module processor (1590); and a voltage and/or current monitor (1580) for monitoring the output power level of said regulated solar array module,
wherein said additional DC/DC converter includes a controller (1562);
wherein said module processor is in communication flow with said voltage and/or current monitor to thereby obtain the maximum power point (MPP) of the output power level of said regulated solar array module;

wherein said module processor is in communication flow with said controller to thereby control said controllable output voltage, based on said MPP of said output power level; and wherein said additional DC/DC converter combines with said at least one DC/DC converter, to provide said control of said controllable output voltage to provide a maximum power output of said regulated solar array module in different light, temperature and other conditions and to maximize solar modules power generation.

47. The solar power generation system of claim 46, being a regulated solar power generation system (1800), further comprises a central control system (1890), having a central controller (1870), wherein said regulated solar power generation system comprises multiple solar array modules arranged in at least one string of regulated solar array modules;

wherein said central controller operatively controls said module processor to control the maximum power output of the respective solar string of modules; and wherein said central controller of said central control system monitors and controls the output voltage of each of said at least one string of regulated solar array modules, to thereby provide a maximum power output of said at least one string of regulated solar array modules in different light, temperature and other conditions.

48. The solar power generation system of claim 47, wherein a preconfigured number of said regulated solar array modules are electrically connected in series to form a string of solar-array modules, wherein said array of solar-array modules produces a third output voltage level.

49. The solar power generation system of claim 48, wherein said third output voltage level is sufficient to meet an application operating voltage level requirement.

50. The solar power generation system of claim 48, wherein a preconfigured number of said strings of solar-array modules are electrically connected in parallel, to form an array of solar-array modules, wherein said array of solar-array modules produces a fourth output power level.

51. The solar power generation system of claim 50, wherein said fourth output power level is sufficient to meet an application operating power level requirement.

52. The solar power generation system of claim 46, wherein said DC/DC converter comprises MOSFET transistors or other suitable type of transistors.

53. A solar power generation system for minimizing the power degradation inflicted by light obstructions, the system comprising at least one solar array module, wherein said at least one solar array module comprises:

a multiplicity of solar cells, physically arranged in an N column by M row matrix configuration, wherein a first matrix comprises the cells in the $1^{st}$ to N/2 columns; wherein the cells in each row of said first matrix are connected in series; wherein adjacent cells in adjacent rows of said first matrix are connected in parallel;

wherein a second matrix comprises the cells in the N/2+1 till the $N^{th}$ column; wherein the cells in each row of said second matrix are connected in series; wherein adjacent cells in adjacent rows of said second matrix are connected in parallel;

wherein the cells in the $1+n^{th}$ column of said first matrix are connected in parallel with cells of the $N-n^{th}$ column of said second matrix, where n is an integer and $0 \leq n < N/2$;

wherein the positive side of the $m^{th}$ cell in the $1^{st}$ column is electrically connected to the positive side of the $m^{th}$ cell in the $N^{th}$ column, where m is an integer and $1 \leq m \leq M$ and wherein the negative side of the $m^{th}$ cell in the N/2 column is electrically connected to the negative side of the $m^{th}$ cell in the N/2+1 column, where m is an integer and $1 \leq m \leq M$.

54. A solar power generation system for minimizing the power degradation inflicted by light obstructions, the system comprising at least one solar array module, wherein said at least one solar array module comprises:

a plurality of solar cells, physically arranged in an N column by M row matrix configuration, wherein a first matrix comprises the cells in the $1^{st}$ to N/2 columns; wherein the cells in each row of said first matrix are connected in series; wherein adjacent cells in adjacent rows of said first matrix are connected in parallel;

wherein a second matrix comprises the cells in the N/2+1 till the $N^{th}$ columns; wherein the cells in each row of said second matrix are connected in series; wherein adjacent cells in adjacent rows of said second matrix are connected in parallel;

wherein the negative side of the $m^{th}$ cell in the $1^{st}$ column is electrically connected to the negative side of the $m^{th}$ cell in the $N^{th}$ column, where m is an integer and $1 \leq m \leq M$; and wherein the positive side of the $m^{th}$ cell in the N/2 column is electrically connected to the positive side of the $m^{th}$ cell in the N/2+1 column, where m is an integer and $1 \leq m \leq M$.

* * * * *